United States Patent
Saito et al.

(10) Patent No.: US 6,415,432 B1
(45) Date of Patent: Jul. 2, 2002

(54) LITHOGRAPHY PATTERN DATA GENERATION METHOD, LITHOGRAPHY PATTERN FABRICATION METHOD AND CHARGED PARTICLE LITHOGRAPHY SYSTEM

(75) Inventors: Takashi Saito, Osaka; Hisashi Watanabe, Shiga, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/551,880

(22) Filed: Apr. 18, 2000

(30) Foreign Application Priority Data

Apr. 21, 1999 (JP) .......................................... 11-113102

(51) Int. Cl.[7] ............................. G21K 5/10; G06F 17/50
(52) U.S. Cl. ........................ 716/21; 716/19; 250/492.22
(58) Field of Search .............................. 716/19, 20, 21; 250/492.1, 492.2, 492.21, 492.22, 492.23, 492.24, 492.3

(56) References Cited

U.S. PATENT DOCUMENTS

| 5,404,018 A | * | 4/1995 | Yasuda et al. ......... 250/492.22 |
| 6,047,116 A | * | 4/2000 | Murakami et al. .............. 716/1 |
| 6,064,807 A | * | 5/2000 | Arai et al. ..................... 716/21 |

FOREIGN PATENT DOCUMENTS

| JP | 62-139322 | 6/1987 |
| JP | 63-257226 | 10/1988 |
| JP | 01-297823 | 11/1989 |
| JP | 08-306608 | 11/1996 |
| JP | 10-189418 | 7/1998 |
| JP | 11-040482 | 2/1999 |
| JP | 11-067648 | 3/1999 |
| JP | 11-233061 | 8/1999 |
| JP | 11-274036 | 10/1999 |

OTHER PUBLICATIONS

"Notice of Reasons of Rejection" from JPO (with English translation), Dated: Feb. 26, 2002.

* cited by examiner

Primary Examiner—Matthew Smith
Assistant Examiner—Leigh Marie Garbowski
(74) Attorney, Agent, or Firm—Eric J. Robinson; Nixon Peabody LLP

(57) ABSTRACT

A lithography pattern data generation method of this invention includes steps of dividing a predetermined area where said plural design data are arranged, which corresponds to an area where design patterns are to be formed, into plural partial exposure areas each in the shape of a stripe with a width corresponding to a deflection width of an exposure beam; extracting, from the plural design data, design data each falling within any of the plural partial exposure areas as a first design data group and extracting design data each extending over two or more of the plural partial exposure areas as a second design data group; generating first lithography pattern data of each of the plural partial exposure areas from the design data belonging to the first design data group; and generating second lithography pattern data of each of the plural partial exposure areas from the design data belonging to the second design data group.

26 Claims, 20 Drawing Sheets

LITHOGRAPHY PATTERN DATA GENERATION METHOD, LITHOGRAPHY PATTERN FABRICATION METHOD AND CHARGED PARTICLE LITHOGRAPHY SYSTEM

BACKGROUND OF THE INVENTION

The present invention relates to a lithography pattern data generation method, a patterning method and a charged particle lithography system for use in drawing design patterns onto a substrate to be patterned by using an exposure beam of charged particles in fabrication of a semiconductor device, a liquid crystal display device or a thin film magnetic head device.

In the photolithography technique currently used for fabricating semiconductor devices, a bright line of a mercury lamp (i-line) of a wavelength of 365 nm or a KrF excimer laser beam of a wavelength of 248 nm is used as a light source. Furthermore, an ArF excimer laser beam of a wavelength of 193 nm is to be used as the light source of the next generation. However, f or further refinement of devices, there are limits in the photolithography. Therefore, a variety of lithography techniques have been proposed, among which lithography using charged particles, in particular, an electron beam is attracting attention.

Now, a lithography method using a conventional electron beam lithography system will be described with reference to a drawing.

FIG. 18 is a schematic diagram of an electron optical lens barrel of the conventional electron beam lithography system. As is shown in FIG. 18, above awafer 202 supported on the top surface of a movable stage 201 is disposed an electron gun 204 for emitting an electron beam 203 to the wafer 202. Between the movable stage 201 and the electron gun 204, a first aperture 205 having a first opening 205a in a square shape, a selective deflection device 206 for selectively deflecting the electron beam 203 having passed through the first opening 205a, a second aperture 207 having a second opening 207a in a square shape, and a reducing lens 208 for reducing an exposure beam with a square section, that is, the electron beam having passed through the second opening 207a, are successively disposed in this order in the direction from the electron gun 204 toward the movable stage 201.

On the inside of the reducing lens 208, a primary deflection device 209A for deflecting the exposure beam is disposed, and on the inside of the primary deflection device 209A, a secondary deflection device 209B is disposed in an upper portion and a tertiary deflection device 209C is disposed in a lower portion.

The lithography system having the aforementioned structure is operated as follows:

First, the electron beam 203 emitted from the electron gun 204 supplied with an acceleration voltage of approximately 50 kV is shaped, by the first opening 205a, to have a square section in a perpendicular direction to the proceeding direction of the electron beam 203. The shaped electron beam 203 is deflected by the selective deflection device 206 before reaching the second opening 207a, so that the electron beam 203 having passed through the second opening 207a can be shaped to have a desired square section, for example, a rectangular section.

Next, the electron beam 203 having been shaped into a desired square shape is allowed to irradiate a predetermined area on the wafer 202 by the deflection devices 209A, 209B and 209C. Thus, exposed patterns corresponding to design data are successively drawn.

The primary deflection device 209A has a deflection area in a rectangular shape of approximately 3 mm by 5 mm at most. In general, a pattern to be drawn is sufficiently larger than the deflection area. Therefore, in exposure using an electron beam, a pattern formation area is divided into partial exposure areas each in the shape of a stripe with a width corresponding to or smaller than the maximum deflectable width, and the patterns are drawn in each of the divided partial exposure areas. Accordingly, a pattern data extending over plural partial exposure areas is divided into design data of each partial exposure area to be stored in a data storage unit of the system.

FIG. 19 shows an example of the conventional lithography pattern data generation method by dividing the lithography pattern data into the stripe areas. As is shown in FIG. 19, lithography pattern data 211 through 216 are arranged on a data arranging area 210, which is divided into first through third stripe areas 221, 222 and 223 each with a width of 5 mm. The lithography pattern data 211 and 212 fall within the first stripe area 221, and the lithography pattern data 213 extends over the first stripe area 221 and the second stripe area 222. Similarly, the lithography pattern data 214 extends over the second stripe area 222 and the third stripe area 223. Accordingly, for example, the lithography pattern data 213 is generated dividedly between the first stripe area 221 and the second stripe area 222.

The conventional lithography pattern data generation method, however, have the following problems: Since exposure is conducted by deflecting the electron beam in each of the stripe areas 221, 222 and 223 as is shown in FIG. 19, the positional accuracy of the exposed patterns is sufficiently high within each stripe area. In contrast, since the movable stage 201 supporting the wafer 202 shown in FIG. 18 is moved between adjacent stripe areas, there arises a connection error in an exposed pattern extending over the adjacent stripe areas. Accordingly, as is shown in FIG. 20(a), a first partial exposure area 221A corresponding to the first stripe area 221 can be away from a second partial exposure area 222A corresponding to the second stripe area 222, or the second partial exposure area 222A can overlap a third pattern exposure area 223A corresponding to the third stripe area 223.

Such a connection error derives from insufficient accuracy in positioning the movable stage 201 or insufficient stability of the electron beam output. Such a connection error leads to the following defects: In the lithography pattern data 213 and 214 extending over the adjacent partial exposure areas, when the adjacent pattern exposure areas are away from each other, disconnection can be caused, for example, in a negative resist, as is shown as a first defective pattern 217A of FIG. 20(b), or when the adjacent pattern exposure areas are slightly away from each other, a line width failure where the line width is locally reduced can be caused as is shown as a second defective pattern 217B of FIG. 20(b). Alternatively, when the partial exposure areas overlap each other, a third defective pattern 217C where the line width is locally increased can be caused. In any case, such defects lead to a failure in a circuit pattern, which can degrade the yield of devices.

SUMMARY OF THE INVENTION

In view of the aforementioned conventional problems, an object of the invention is forming a resist pattern in a desired shape by preventing deformation of the resist pattern derived from a connection error between adjacent partial exposure areas in using a charged particle beam.

In order to achieve the object, in generation of lithography pattern data from design data according to the invention, plural design data are arranged in a data arranging area corresponding to a design pattern formation area, and the data arranging area is divided into plural partial exposure areas. From plural design data on the divided data arranging area, design data extending over two or more partial exposure areas are extracted, and the data arranging area is divided again so that at least one of the extracted design data can fall within one partial exposure area, or the extracted design data are subjected to multiple exposure.

Specifically, the first lithography pattern data generation method of this invention for generating, from plural design data corresponding to design patterns, lithography pattern data to be drawn correspondingly to the design patterns on a substrate by using an exposure beam of charged particles, comprises an area dividing step of dividing a predetermined area where the plural design data are arranged, which corresponds to an area where the design patterns are to be formed, into plural partial exposure areas each in the shape of a stripe with a width corresponding to a deflection width of the exposure beam; a data extracting step of extracting, from the plural design data, design data each falling within any of the plural partial exposure areas as a first design data group, and extracting design data each extending over two or more of the plural partial exposure areas as a second design data group; a first lithography pattern data generating step of generating first lithography pattern data of each of the plural partial exposure areas from the design data belonging to the first design data group; and a second lithography pattern data generating step of generating second lithography pattern data of each of the plural partial exposure areas from the design data belonging to the second design data group.

According to the first lithography pattern data generation method, with respect to the second design data group consisting of the design data extending over two or more of the plural partial exposure areas, the lithography pattern data are generated based on other partial exposure areas obtained by differently dividing the predetermined area. Alternatively, the lithography pattern data are generated by conducting multiple exposure with the predetermined area divided into the original partial exposure areas. Thus, a connection error can be prevented from occurring in the design data belonging to the second design data group.

In the first lithography pattern data generation method, in extracting the first design data group in the data group extracting step, a design data, among the design data each extending over two or more of the plural partial exposure areas, which has a portion crossing a boundary of the partial exposure areas and having a predetermined size or larger is preferably included in the first design data group. In this manner, among the design data extending over two or more plural partial exposure areas, the design data having the portion crossing the boundary of the partial exposure areas in the predetermined size or larger can belong to the first design data group falling within any of the plural partial exposure areas. Even in this case, since the crossing portion of the design data extending over the partial exposure areas is in the predetermined size or larger, the width of a connecting part between the divided design data can be larger in the exposure than the width of another design data not divided between the exposure areas. Accordingly, the design data is minimally affected by a connection error. Also, since the number of times of repeating the process, that is, a general technique of data processing, can be reduced because the number of data belonging to the second design data group is decreased, resulting in improving the through-put.

The second lithography pattern data generation method of this invention for generating, from plural design data corresponding to design patterns, lithography pattern data to be drawn correspondingly to the design patterns on a substrate by using an exposure beam of charged particles, comprises a first area dividing step of dividing a predetermined area where the plural design data are arranged, which corresponds to an area where the design patterns are to be formed, into plural first partial exposure areas each in the shape of a stripe with a width corresponding to a deflection width of the exposure beam; a data group extracting step of extracting, from the plural design data, design data each falling within any of the plural first partial exposure areas as a first design data group, and extracting design data each extending over two or more of the plural first partial exposure areas as a second design data group; a first lithography pattern data generating step of generating first lithography pattern data of each of the plural first partial exposure areas from the design data belonging to the first design data group; a second area dividing step of dividing the predetermined area into plural second partial exposure areas any of which covers at least one of the design data belonging to the second design data group, the plural second partial exposure areas being different from the plural first partial exposure areas; and a second lithography pattern data generating step of generating second lithography pattern data of each of the plural second partial exposure areas from the design data belonging to the second design data group.

According to the second lithography pattern data generation method, at least one of the design data belonging to the second design data group does not extend over two or more partial exposure areas. Therefore, the number of design data divided between two or more partial exposure areas among the plural design data can be definitely reduced, resulting in improving the accuracy of the exposed patterns. As a result, disconnection or deformation of an exposed pattern derived from a resist pattern having a connection error can be prevented, which improves the performance of semiconductor devices and increase the production yield.

In the second lithography pattern data generation method, in the second area dividing step, each of the plural second partial exposure areas preferably has a width different from a width of each of the plural first partial exposure areas. In this manner, in dividing the predetermined area into the plural second partial exposure areas, the second partial exposure areas can be divided to have a width different from that of the first partial exposure areas. Therefore, any of the design data belonging to the second design data group can easily fall within any of the second partial exposure areas, resulting in reducing the number of design data divided between the plural partial exposure areas.

In the second lithography pattern data generation method, in extracting the first design data group in the data group extracting step, each of the plural first partial exposure areas is preferably enlarged by a predetermined width, and the first design data group is preferably extracted on the basis of the plural first partial exposure areas with the enlarged width. Since the range of extracting the design data as the first design data group is thus enlarged by expecting a margin of a deflection width of the exposure beam, even a design data positioned on the boundary of the first partial exposure areas can fall within one partial exposure area. Thus, the number of design data belonging to the first design data group can be increased and on the contrary, the number of design data belonging to the second design data group can be reduced. Accordingly, in repeatedly dividing the partial exposure areas several times, the repeated processes can be rapidly converged, resulting in improving the through-put.

In the second lithography pattern data generation method, in extracting the first design data group in the data group extracting step, a design data, among the design data each extending over two or more of the plural first partial exposure areas, which has a portion crossing a boundary of the plural first partial exposure areas and having a predetermined size or larger is preferably included in the first design data group.

The third lithography pattern data generation method of this invention for generating, from plural design data corresponding to design patterns, lithography pattern data to be drawn correspondingly to the design patterns on a substrate by using an exposure beam of charged particles, comprises a first area dividing step of dividing a predetermined area where the plural design data are arranged, which corresponds to an area where the design patterns are to be formed, into plural first partial exposure areas each in the shape of a stripe with a width corresponding to a deflection width of the exposure beam; a first data group extracting step of extracting, from the plural design data, design data each falling within any of the plural first partial exposure areas as a first design data group, and extracting design data each extending over two or more of the plural first partial exposure areas as a second design data group; a first lithography pattern data generating step of generating first lithography pattern data of each of the plural first partial exposure areas from the design data belonging to the first design data group; a second area dividing step of dividing the predetermined area into plural second partial exposure areas any of which covers at least one of the design data belonging to the second design data group, the plural second partial exposure areas being different from the plural first partial exposure areas; a second data group extracting step of extracting, from the second design data group, design data each falling within any of the plural second partial exposure areas as a third design data group, and extracting design data each extending over two or more of the plural second partial exposure areas as a fourth design data group; a second lithography pattern data generating step of generating second lithography pattern data of each of the plural second partial exposure areas from the design data belonging to the third design data group; a third area dividing step of dividing the predetermined area into plural third partial exposure areas any of which covers at least one of the design data belonging to the fourth design data group, the plural third partial exposure areas being different from the plural second partial exposure areas; and a third lithography pattern data generating step of generating third lithography pattern data of each of the third partial exposure areas from the design data belonging to the fourth design data group.

According to the third lithography pattern data generation method, in addition to the steps of the second lithography pattern data generation method, design data each falling within any of the plural second partial exposure areas are extracted as the third design data group and design data each extending over two or more of the second partial exposure areas are extracted as the fourth design data group. Therefore, the number of design data extending over the boundary of the partial exposure areas among all the design data can be further reduced, resulting in further reducing connection errors.

In the third lithography pattern data generation method, in the second area dividing step, each of the plural second partial exposure areas preferably has a width different from a width of each of the plural first partial exposure areas, and in the third area dividing step, each of the plural third partial exposure areas preferably has a width different from the width of each of the plural first partial exposure areas or the width of each of the plural second partial exposure areas.

The third lithography pattern data generation method preferably further comprises, after the third lithography pattern data generating step, a repeating step of repeating sub-steps of dividing the predetermined area into plural partial exposure areas and generating lithography pattern data until none of the design data extends over two or more of the plural partial exposure areas. In this manner, a connection error can be avoided in all the lithography pattern data of the design data.

In the third lithography pattern data generation method, in extracting the first design data group in the first data group extracting step, each of the first partial exposure areas is preferably enlarged by a predetermined width, and the first design data group is preferably extracted on the basis of the first partial exposure areas with the enlarged width, and in extracting the third design data group in the second data group extracting step, each of the second partial exposure areas is preferably enlarged by a predetermined width, and the third design data group is preferably extracted on the basis of the second partial exposure areas with the enlarged width.

In the third lithography pattern data generation method, in extracting the first design data group in the first data group extracting step, a design data, among the design data each extending over two or more of the plural first partial exposure areas, which has a portion crossing a boundary of the first partial exposure areas and having a predetermined size or larger is preferably included in the first design data group, and in extracting the third design data group in the second data group extracting step, a design data, among the design data each extending over two or more of the plural second partial exposure areas, which has a portion crossing a boundary of the second partial exposure areas and having a predetermined size or larger is preferably included in the third design data group. In this manner, a design data having a portion crossing the boundary of the partial exposure areas in the predetermined size or larger can be included in the first design data group or the third design data group because a connection error is scarcely caused therein. Therefore, the numbers of design data belonging to the second design data group and the fourth design data group can be reduced.

The third lithography pattern data generation method preferably further comprises, after the third lithography pattern data generating step, steps of extracting, from the design data belonging to the fourth design data group, a design data which has a size, along a widthwise direction of each third partial exposure area, larger than a width of each third partial exposure area and includes a wide portion having a length, along a perpendicular direction to an exposure direction corresponding to an extending direction of the third partial exposure areas, smaller than the width of each third partial exposure area and a width, along the exposure direction, larger than a predetermined value, and dividing the predetermined area into plural fourth partial exposure areas with the wide portion positioned on a boundary of the fourth partial exposure areas. Among the design data belonging to the fourth design data group, a design data in the size along the widthwise direction of the third partial exposure area larger than the width of the third partial exposure area cannot fall within one partial exposure area even when the partial exposure areas are differently divided. Therefore, the repeated processes cannot be converged. However, in the aforementioned manner, a design data having a wide portion with the width along the exposure direction larger than a predetermined value is extracted and the predetermined area is divided with the wide portion of the extracted design data positioned on the boundary of the partial exposure areas. Therefore, a connection error is scarcely caused even in the exposed pattern obtained from the divided data.

In the third lithography pattern data generation method, in the third lithography pattern data generating step, with respect to a design data having a size, along a widthwise direction of each third partial exposure area, larger than a width of each third partial exposure area, an auxiliary pattern data for preventing deformation of an exposed pattern to be drawn on the substrate is preferably added onto a portion where the design data crosses a boundary of the third partial exposure areas. A design data in the size a long the width wise direction of the third partial exposure area larger than the width of the third partial exposure area cannot fall within one partial exposure area even when the predetermined area is differently divided, and hence, the repeated processes cannot be converged. However, in the aforementioned manner, the auxiliary pattern data for preventing the deformation of the exposed pattern is added to the portion of the design data where it crosses the boundary of the third partial exposure areas. Therefore, a connection error is scarcely caused even in the exposed pattern obtained from the divided data.

The fourth lithography pattern data generation method of this invention for generating, from plural design data corresponding to design patterns, lithography pattern data to be drawn correspondingly to the design patterns on a substrate by using an exposure beam of charged particles, comprises a data group generating step of generating, from the plural design data, a first design data group having a pattern width larger than a predetermined value and a second design data group having a pattern width smaller than the predetermined value; a first area dividing step of dividing a predetermined area where the plural design data are arranged, which corresponds to an area where the design patterns are to be formed, into plural first partial exposure areas each in the shape of a stripe with a width corresponding to a deflection width of the exposure beam; a first lithography pattern data generating step of generating first lithography pattern data of each of the plural first partial exposure areas from the design data belonging to the first design data group; a data group extracting step of extracting, from the second design data group, design data each falling within any of the plural first partial exposure areas as a third design data group, and extracting design data each extending over two or more of the plural first partial exposure areas as a fourth design data group; a second lithography pattern data generating step of generating second lithography pattern data of each of the plural first partial exposure areas from the design data belonging to the third design data group; a second area dividing step of dividing the predetermined area into plural second partial exposure areas any of which covers at least one of the design data belonging to the fourth design data group, the plural second partial exposure areas being different from the plural first partial exposure areas; and a third lithography pattern data generating step of generating third lithography pattern data of each of the plural second partial exposure areas from the design data belonging to the fourth design data group.

According to the fourth lithography pattern data generation method, before dividing the predetermined area into the plural first partial exposure areas, the first design data group consisting of design data with a pattern width larger than a predetermined value and the second design data group consisting of design data with a pattern width smaller than the predetermined value are previously generated. Therefore, even when the predetermined area is divided into the plural second partial exposure areas in the same manner as in the second lithography pattern data generation method, the number of data belonging to the fourth design data group extending over the first partial exposure area is smaller than the number of data belonging to the second design data group obtained in the second lithography pattern data generation method. Accordingly, even when the process is repeated with the predetermined area differently divided into partial exposure areas, the number of times of repeating the process can be largely reduced.

The first lithography pattern fabrication method of this invention for generating, from plural design data corresponding to design patterns, lithography pattern data to be drawn correspondingly to the design patterns on a substrate and drawing the generated lithography pattern data on the substrate by using an exposure beam of charged particles, comprises a first area dividing step of dividing a predetermined area where the plural design data are arranged, which corresponds to an area where the design patterns are to be formed, into plural first partial exposure areas each in the shape of a stripe with a width corresponding to a deflection width of the exposure beam; a data group extracting step of extracting, from the plural design data, design data each falling within any of the plural first partial exposure areas as a first design data group, and extracting design data each extending over two or more of the plural first partial exposure areas as a second design data group; a first lithography pattern data generating step of generating first lithography pattern data of each of the plural first partial exposure areas from the design data belonging to the first design data group; a second area dividing step of dividing the predetermined area into plural second partial exposure areas any of which covers at least one of the design data belonging to the second design data group, the plural second partial exposure areas being different from the plural first partial exposure areas; a second lithography pattern data generating step of generating second lithography pattern data of each of the plural second partial exposure areas from the design data belonging to the second design data group; a first patterning step of drawing first exposed patterns corresponding to the first lithography pattern data on the substrate by adjusting the exposure beam in accordance with the first lithography pattern data; and a second patterning step of drawing second exposed patterns corresponding to the second lithography pattern data on the substrate by adjusting the exposure beam in accordance with the second lithography pattern data.

According to the first lithography pattern fabrication method, the predetermined area where the design data are arranged is divided into the plural second partial exposure areas any of which covers at least one of the design data belonging to the second design data group, and which are different from the first partial exposure areas. Therefore, the number of design data divided between two or more partial exposure areas among the plural design data can be reduced. Accordingly, in drawing the second exposed pattern on the substrate on the basis of the second lithography pattern data including the design data divided between two or more partial exposure areas, the number of divided design data can be reduced, resulting in reducing exposed patterns with connection errors.

In the first lithography pattern fabrication method, in extracting the first design data group in the data group extracting step, each of the first partial exposure areas is preferably enlarged by a predetermined width, and the first design data group is preferably extracted on the basis of the first partial exposure areas with the enlarged width.

In the first lithography pattern fabrication method, in extracting the first design data group in the data group extracting step, a design data, among the design data each extending over two or more of the plural first partial exposure extracting step of extracting, from the plural design data, design data each falling with in any of the plural first partial exposure areas as a first design data group, and extracting design data each extending over two or more of the plural first partial exposure areas as a second design data group; a first lithography pattern data generating step of generating first lithography pattern data of each of the plural first partial exposure areas from the design data belonging to the first design data group; a second area dividing step of dividing the predetermined area into plural second partial exposure areas any of which covers at least one of the design data belonging to the second design data group, the plural second partial exposure areas being different from the plural first partial exposure areas; a second data group extracting step of extracting, from the second design data group, design data each falling within any of the plural second partial exposure areas as a third design data group, and extracting design data each extending over two or more of the plural second partial exposure areas as a fourth design data group; a second lithography pattern data generating step of generating second lithography pattern data of each of the plural second partial exposure areas from the design data belonging to the third design data group; a third area dividing step of dividing the predetermined area into plural third partial exposure areas any of which areas, which has a portion crossing a boundary of the first partial exposure areas and having a predetermined size or larger is preferably included in the first design data group.

In this case, in the second patterning step, multiple exposure is preferably conducted on a design data belonging to the second design data group. In this manner, a connection error caused in a design data extending over the boundary of the partial exposure areas, in particular, a connection error caused when the partial exposure areas are away from each other, can be prevented. In addition, since the multiple exposure is conducted on merely the design data extending over the second partial exposure areas, the through-put can be improved.

The second lithography pattern fabrication method of this invention for generating, from plural design data corresponding to design patterns, lithography pattern data to be drawn correspondingly to the design patterns on a substrate and drawing the generated lithography pattern data on the substrate by using an exposure beam of charged particles, comprises a first area dividing step of dividing a predetermined area where the plural design data are arranged, which corresponds to an area where the design patterns are to be formed, into plural first partial exposure areas each in the shape of a stripe with a width corresponding to a deflection width of the exposure beam; a first data group covers at least one of the design data belonging to the fourth design data group, the plural third partial exposure areas being different from the plural second partial exposure areas; a third lithography pattern data generating step of generating third lithography pattern data of each of the plural third partial exposure areas from the design data belonging to the fourth design data group; a first patterning step of drawing first exposed patterns corresponding to the first lithography pattern data on the substrate by adjusting an output state, a deflection state or an irradiation position on the substrate of the exposure beam in accordance with the first lithography pattern data; a second patterning step of drawing second exposed patterns corresponding to the second lithography pattern data on the substrate by adjusting the output state, the deflection state or the irradiation position on the substrate of the exposure beam in accordance with the second lithography pattern data; and a third patterning step of drawing third exposed patterns corresponding to the third lithography pattern data on the substrate by adjusting the output state, the deflection state or the irradiation position on the substrate of the exposure beam in accordance with the third lithography pattern data.

According to the second lithography pattern fabrication method, the lithography pattern data to be drawn on the substrate correspondingly to the design data are generated from the plural design data corresponding to the design patterns by the third lithography pattern data generation method of this invention. Therefore, the number of design data extending over two or more partial exposure areas among all the design data can be further reduced. As a result, in drawing the third exposed patterns on the substrate on the basis of the third lithography pattern data including the design data divided between two or more partial exposure areas, the number of connecting portions between the divided design data can be reduced, and hence, the number of connection errors can be further reduced. Accordingly, further accurate exposed patterns can be obtained.

In the second lithography pattern fabrication method, in extracting the first design data group in the first data group extracting step, each of the first partial exposure areas is preferably enlarged by a predetermined width, and the first design data group is preferably extracted on the basis of the first partial exposure areas with the enlarged width, and in extracting the third design data group in the second data group extracting step, each of the second partial exposure areas is preferably enlarged by a predetermined width, and the third design data group is preferably extracted on the basis of the second partial exposure areas with the enlarged width.

In the second lithography pattern fabrication method, in extracting the first design data group in the first data group extracting step, a design data, among the design data each extending over two or more of the plural first partial exposure areas, which has a portion crossing a boundary of the first partial exposure areas and having a predetermined size or larger is preferably included in the first design data group, and in extracting the third design data group in the second data group extracting step, a design data, among the design data each extending over two or more of the plural second partial exposure areas, which has a portion crossing a boundary of the second partial exposure areas having a predetermined size or larger is preferably included in the third design data group.

In this case, in the third patterning step, multiple exposure is preferably conducted on a design pattern belonging to the fourth design data group.

The third lithography pattern fabrication method of this invention for generating, from plural design data corresponding to design patterns, lithography pattern data to be drawn correspondingly to the design patterns on a substrate and drawing the generated lithography pattern data on the substrate by using an exposure beam of charged particles, comprises an area dividing step of dividing a predetermined area where the plural design data are arranged, which corresponds to an area where the design patterns are to be formed, into plural partial exposure areas each in the shape of a stripe with a width corresponding to a deflection width of the exposure beam; a data group extracting step of extracting, from the plural design data, design data each falling within any of the plural partial exposure areas as a first design data group, and extracting design data each extending over two or more of the plural partial exposure areas as a second design data group; a first lithography pattern data generating step of generating first lithography pattern data of each of the plural partial exposure areas from the design data belonging to the first design data group; a second lithography pattern data generating step of generating second lithography pattern data of each of the plural partial exposure areas from the design data belonging to the second design data group; a first pattern lithography step of drawing first exposed patterns corresponding to the first lithography pattern data on the substrate by adjusting the exposure beam in accordance with the first lithography pattern data; and a second pattern lithography step of drawing second exposed patterns corresponding to the second lithography pattern data on the substrate by adjusting the exposure beam in accordance with the second lithography pattern data and by carrying out multiple exposure.

According to the third lithography pattern fabrication method, the design data each extending over two or more of the plural partial exposure areas are extracted from the plural design data as the second design data group, and the multiple exposure is carried out on the second lithography pattern data obtained from the design data belonging to the extracted second design data group. Accordingly, even in the second lithography pattern data divided between the adjacent partial exposure areas, a connection error is scarcely caused in the exposed pattern obtained based on the divided lithography pattern data.

In the third lithography pattern fabrication method, in extracting the first design data group in the data group extracting step, a design data, among the design data each extending over two or more of the plural partial exposure areas, which has a portion crossing a boundary of the partial exposure areas and having a predetermined size or larger is preferably included in the first design data group.

The charged particle lithography system of this invention for generating, from plural design data corresponding to design patterns, lithography pattern data to be drawn correspondingly to the design patterns on a substrate and drawing the generated lithography pattern data on the substrate by using an exposure beam of charged particles, comprises charged particle producing means for emitting the exposure beam to the substrate; substrate supporting means for supporting the substrate; beam shaping means disposed between the charged particle producing means and the substrate supporting means for shaping the exposure beam into a predetermined shape; charged particle controlling means for controlling an output state of the charged particle producing means; substrate position controlling means for determining a relative position of the substrate supporting means against the charge particle producing means; beam shape controlling means for controlling the beam shaping means to adjust the shape of the exposure beam; and lithography pattern data generating means for generating the lithography pattern data from the plural design data, and the lithography pattern data generating means includes an area dividing part for dividing a predetermined area where the plural design data are arranged, which corresponds to an area where the design patterns are to be formed, in to plural partial exposure areas each in the shape of a stripe with a variable width corresponding to a deflection width of the exposure beam; a data group extracting part for extracting, from the plural design data, design data each falling within any of the plural partial exposure areas as a first design data group, and extracting design data each extending over two or more of the plural partial exposure areas as a second design data group; and a data generating part for generating first lithography pattern data of each of the plural partial exposure areas from the design data belonging to the first design data group, and generating second lithography pattern data of each of the plural partial exposure areas from the design data belonging to the second design data group, the charged particle controlling means controls an output state of the charged particle producing means on the basis of the generated lithography pattern data, the substrate position controlling means changes a relative position of the substrate supported by the substrate supporting means against the exposure beam emitted by the charged particle producing means on the basis of the generated lithography pattern data, and the beam shape controlling means shapes the exposure beam into a stripe shape corresponding to each of the partial exposure areas on the basis of the generated lithography pattern data.

In the charged particle lithography system of this invention, the lithography pattern data generating means includes the area dividing part for dividing the predetermined area where the design data are arranged, which corresponds to the design pattern formation area, into the plural partial exposure areas each in the shape of a stripe with a width corresponding to the deflection width of the exposure beam, and the data group extracting part for extracting, from the plural design data, design data each falling within any of the stripe areas as the first design data group and extracting design data each extending over two or more of the partial exposure areas as the second design data group. Therefore, when the area dividing part divides the predetermined area where the design data of the second design data group are arranged into other partial exposure areas so that at least one of the design data of the second design data group can be prevented from extending over the boundary of the partial exposure areas, the first lithography pattern fabrication method or the second lithography pattern fabrication method of this invention can be definitely realized.

In the charged particle lithography system, the lithography pattern data generating means preferably conducts multiple exposure on the second lithography pattern data.

BRIEF DESCRIPTION OF THE DRAWINGS

FIGS. 20(a) and 20(b) are diagrams of a lithography operation and resultant exposed patterns obtained by using the conventional electron beam lithography system, in which FIG. 20(a) is a plan view of exemplified partial exposure areas adjacent to each other and FIG. 20(b) is a plan view of exemplified connection errors in the exposed patterns.

DETAILED DESCRIPTION OF THE INVENTION

EMBODIMENT 1

Now, Embodiment 1 of the invention will be described with reference to the accompanying drawings.

Figure 1:
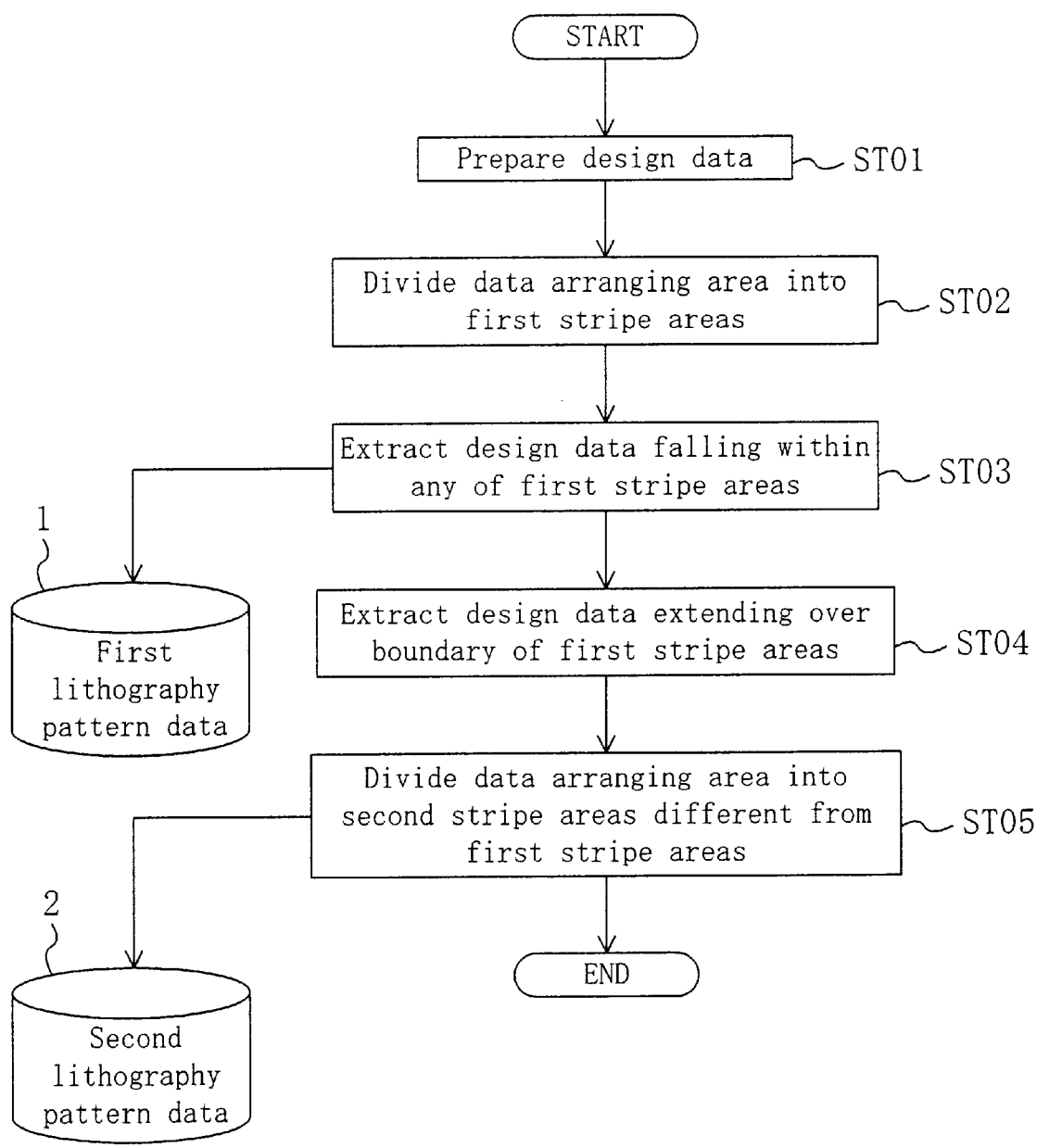
FIG. 1 is a process flowchart of a lithography pattern data generation method according to Embodiment 1 of the invention.
Figure 2A:
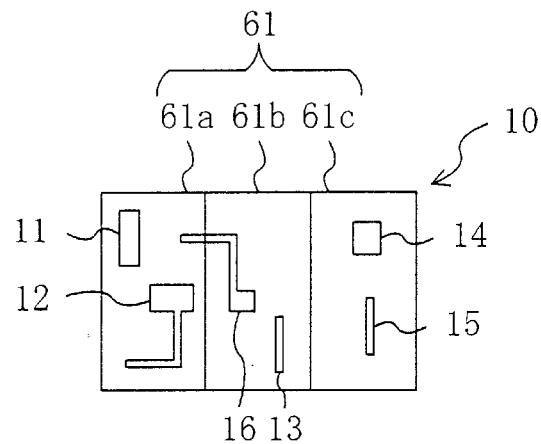
FIGS. 2(a) through 2(c) are plan views of design data groups in respective procedures in the lithography pattern data generation method of Embodiment 1.
Figure 2B:
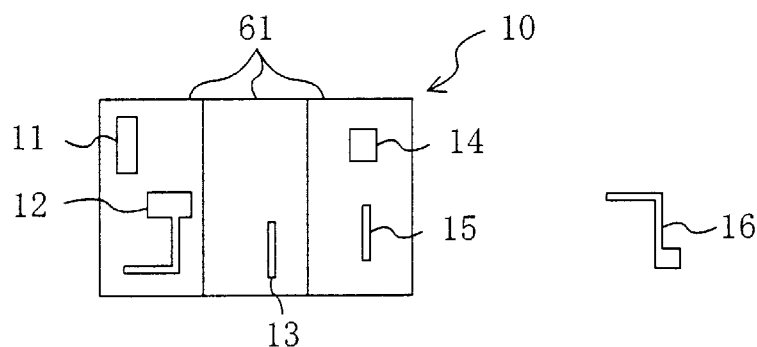
Figure 2C:
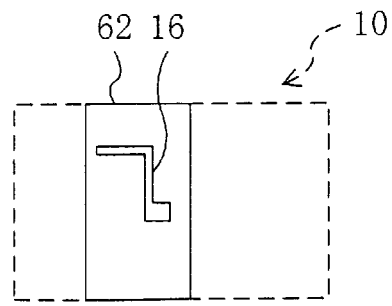

FIG. 1 is a process flowchart of a lithography pattern data generation method of Embodiment 1, and FIGS. 2(a) through 2(c) show the layout of design data in respective procedures in the lithography pattern data generation method of this embodiment. First, in a design data preparing process ST01 of FIG. 1, plural design data 11 through 16 corresponding to design patterns to be formed on a substrate are prepared as is shown in FIG. 2(a). These design data 11 through 16 are arranged in a data arranging area 10 correspondingly to a design pattern formation area.

Next, in a first area dividing process ST02 of FIG. 1, the data arranging area 10 is divided into a first stripe area group 61 including three stripe areas 61a through 61c. Each of the stripe areas 61a through 61c has a width corresponding to, for example, that of a partial exposure area of the exposure beam of an electron beam lithography system, and hence, the width is controlled in accordance with the maximum deflection width of a primary deflection device of the electron beam lithography system. Herein, the first stripe area group 61 has a stripe width of 5 mm.

Then, in a first data group extracting process ST03 of FIG. 1, design data each falling within any of the stripe areas 61a through 61c, namely, design data not extending over any boundary of the stripe areas 61a through 61c, are extracted from the plural design data 11 through 16 as a first design data group. Accordingly, in FIG. 2(b), since each of the design data 11 through 15 falls within any of the stripe areas 61a through 61c, the first design data group consists of the design data 11 through 15. Subsequently, first lithography pattern data 1 of each stripe area of the first stripe area group 61 are generated from the design data 11 through 15 belonging to the first design data group.

Next, in a second data group extracting process ST04 of FIG. 1, design data each extending over plural stripe areas of the first stripe area group 61 are extracted as a second design data group. In FIG. 2(b), since the design data 16 extends over the adjacent stripe areas 61a and 61b, the second design data group consists of the design data 16.

For the sake of explanation, the design data 11 through 16 are herein subjected to the two extracting processes, that is, the first design data group extracting process ST03 and the second design data group extracting process ST04, but needless to say, when one of the first and second design data groups is extracted from the design data 11 through 16, the other data group is naturally determined.

Next, in a second area dividing process ST05 of FIG. 1, the data arranging area 10 is divided, as is shown in FIG. 2(c), to obtain a second stripe area 62, which can cover the design data 16 and is differently divided from the first stripe are a group 61. A second lithography pattern data 2 is generated from the design data 16 falling within the second stripe area 62. Herein, the width of the second stripe area 62 can be the same as or different from the stripe width of the first stripe area group 61.

Thus, among the design data 11 through 16, the design data 16 extending over the boundary in the first stripe area group 61 falls within the second stripe area 62 different from the first stripe area group 61 in this embodiment. Therefore, the second lithography pattern data 2 generated from the design data 16 is free from a connection error. As a result, an exposed pattern obtained based on the second lithography pattern data 2 can be improved in the accuracy.

Also, the exposure beam of charged particles is used as an electron beam in this embodiment, but the generation of lithography pattern data does not depend upon the kind of charged particles.

Specifically, the invention is effective in generating lithography pattern data when the drawing (exposure) area is smaller than a design pattern formation area and hence the lithography pattern data corresponding to design patterns should be divided into plural drawing areas.

Furthermore, it is assumed in this embodiment that the lithography pattern data are generated for drawing design patterns on a semiconductor substrate of a semiconductor integrated circuit device, but the invention is not limited to this application but is effectively applicable to a mask pattern of an exposure mask used in fabrication of a semiconductor integrated circuit device, a design pattern on a display substrate of a liquid crystal display device and a design pattern on a magnetic head of a thin film magnetic head device.

MODIFICATION 1 OF EMBODIMENT 1

Now, Modification 1 of Embodiment 1 of the invention will be described with reference to the accompanying drawings.

Figure 3A:
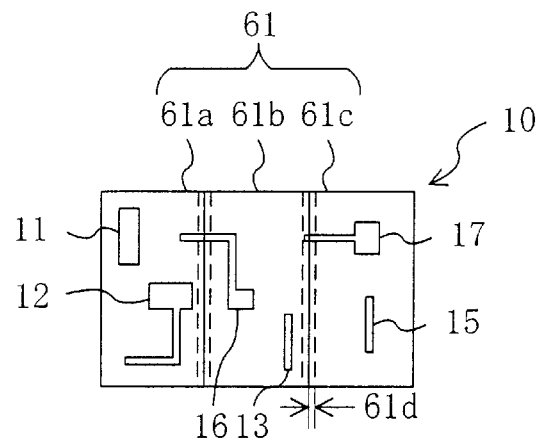
FIGS. 3(a) through 3(c) are plan views of design data groups in respective procedures in a lithography pattern data generation method of Modification 1 of Embodiment 1.
Figure 3B:
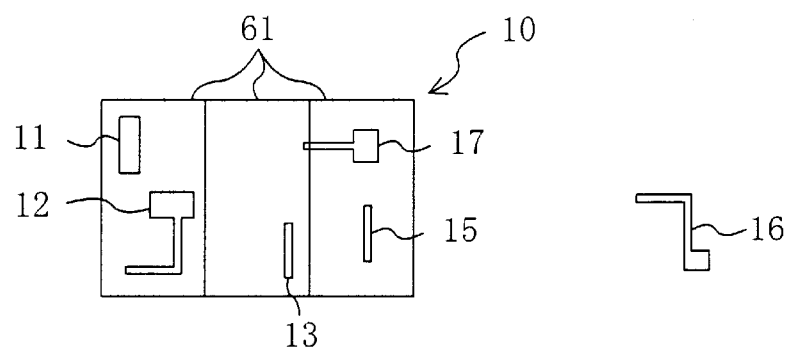
Figure 3C:
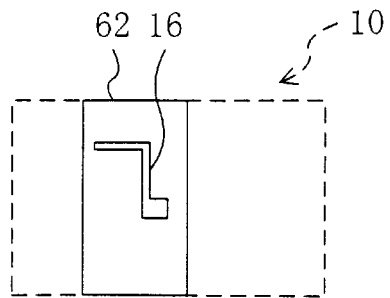

FIGS. 3(a) through 3(c) show the layout of design data in respective procedures in a lithography pattern data generation method of this modification. In FIGS. 3(a) through 3(c), like reference numerals are used to refer to like elements used in FIGS. 2(a) through 2(c), so as to omit the description. As is shown in FIG. 3(a), a design data 17 most of which falls within the stripe area 61c of the first stripe area group 61 has a tip portion extending over the stripe area 61b and the stripe area 61c.

As a characteristic of this modification, in the first design data group extracting process ST03 of FIG. 1, each stripe area of the first stripe area group 61 is enlarged by a predetermined width merely in the extraction, so as to extract the first design data group by using the stripe areas 61a through 61c each with the enlarged width.

In FIG. 3(a), the enlarged predetermined width is indicated as an extraction width 61d, which is set to, for example, approximately 0.5 μm. In this manner, the design data 17 can be determined to be covered by the stripe area 61c in the data extraction of the first design data group extracting process ST03 as is shown in FIG. 3(b), and hence is extracted as the first design data group. Although the maximum deflection area of the primary deflection device is assumed as 5 mm, the primary deflection device of a general electron beam lithography system has a deflection width having a margin of several microns. Therefore, even when an exposed pattern protrudes to the stripe area 61b as in the design data 17 of FIG. 3(b), the pattern can be drawn.

In this manner, in addition to the characteristic of Embodiment 1, the number of design data belonging to the first design data group is increased and the number of design data belonging to the second design data group is decreased in this modification. Therefore, in the case where the process for dividing the area into stripe areas is repeatedly conducted, the repeated processes can be easily converged.

Although the extraction width 61d is set to 0.5 μm in this modification, an appropriate value can be selected depending upon the used electron beam lithography system.

MODIFICATION 2 OF EMBODIMENT 1

Modification 2 of Embodiment 1 will now be described with reference to the accompanying drawings.

Figure 4A:
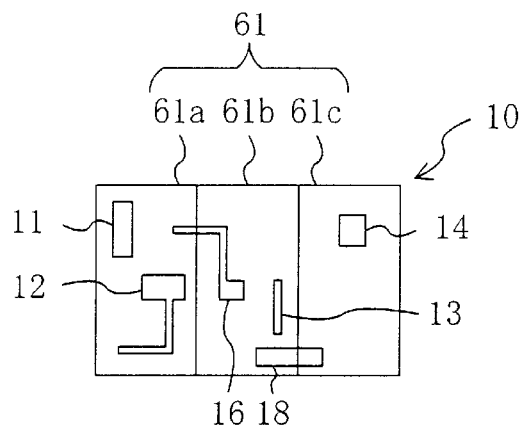
FIGS. 4(a) through 4(c) are plan views of design data groups in respective procedures in a lithography pattern data generation method of Modification 2 of Embodiment 1.
Figure 4B:
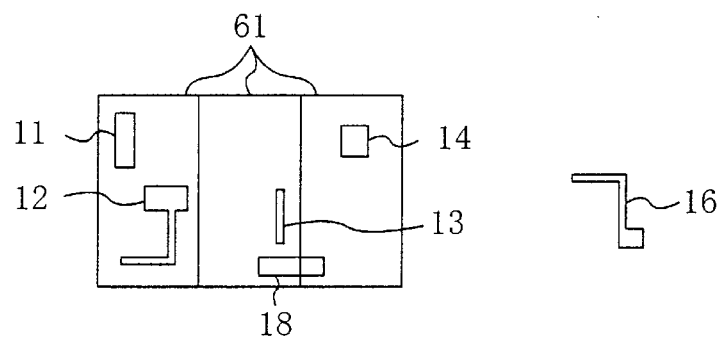
Figure 4C:
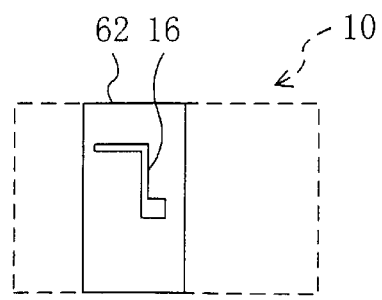

FIGS. 4(a) through 4(c) show the layout of design data in respective procedures in a lithography pattern data generation method of this modification. In FIGS. 4(a) through 4(c), like reference numerals are used to refer to like elements used in FIGS. 2(a) through 2(c), so as to omit the description.

As is shown in FIG. 4(a), among plural design data arranged on the data arranging area 10, design data 16 and 18 extend over the boundaries of the adjacent stripe areas. Also, a portion of the design data 16 crossing the boundary of the stripe areas is assumed to be in the size of 0.4 μm, and a portion of the design data 18 crossing the boundary is assumed to be in the size of 1.2 μm.

As a characteristic of this modification, in the first design data group extracting process ST03 of FIG. 1, among design data each extending over any boundary of the adjacent stripe areas, one having a portion crossing the boundary in the size of 1.0 μm or more is extracted as the first design data group, and one having a portion crossing the boundary in the size smaller than 1.0 μm is extracted as the second design data group.

Although a connection error caused in adjacently connecting divided data corresponds to approximately 50 nm, the design data 18 has the crossing portion in the size of 1 μm or more, and hence is minimally affected by the connection error but can attain sufficient accuracy in the connected exposed pattern. Therefore, the design data 18 can be included in the first design data group.

Accordingly, in addition to the characteristic of Embodiment 1, the number of design data belonging to the second design data group can be decreased. Therefore, in the case where the process for dividing the area into stripe areas is repeatedly conducted, the repeated processes can be easily converged.

Although merely a design data having a portion crossing the boundary of the stripe areas in the size smaller than 1 μm is extracted as the second design data group in this modification, the range of the size is preferable to be optimized depending upon the accuracy of the lithography system and the process conditions.

Also, when the size of the portion crossing the boundary of the stripe areas accords with the predetermined value, for example, 1 μm, the corresponding design data is included in the first design data group in this embodiment, but it can be included in the second design data group.

EMBODIMENT 2

Embodiment 2 of the invention will now be described with reference to the accompanying drawings.

Figure 5:
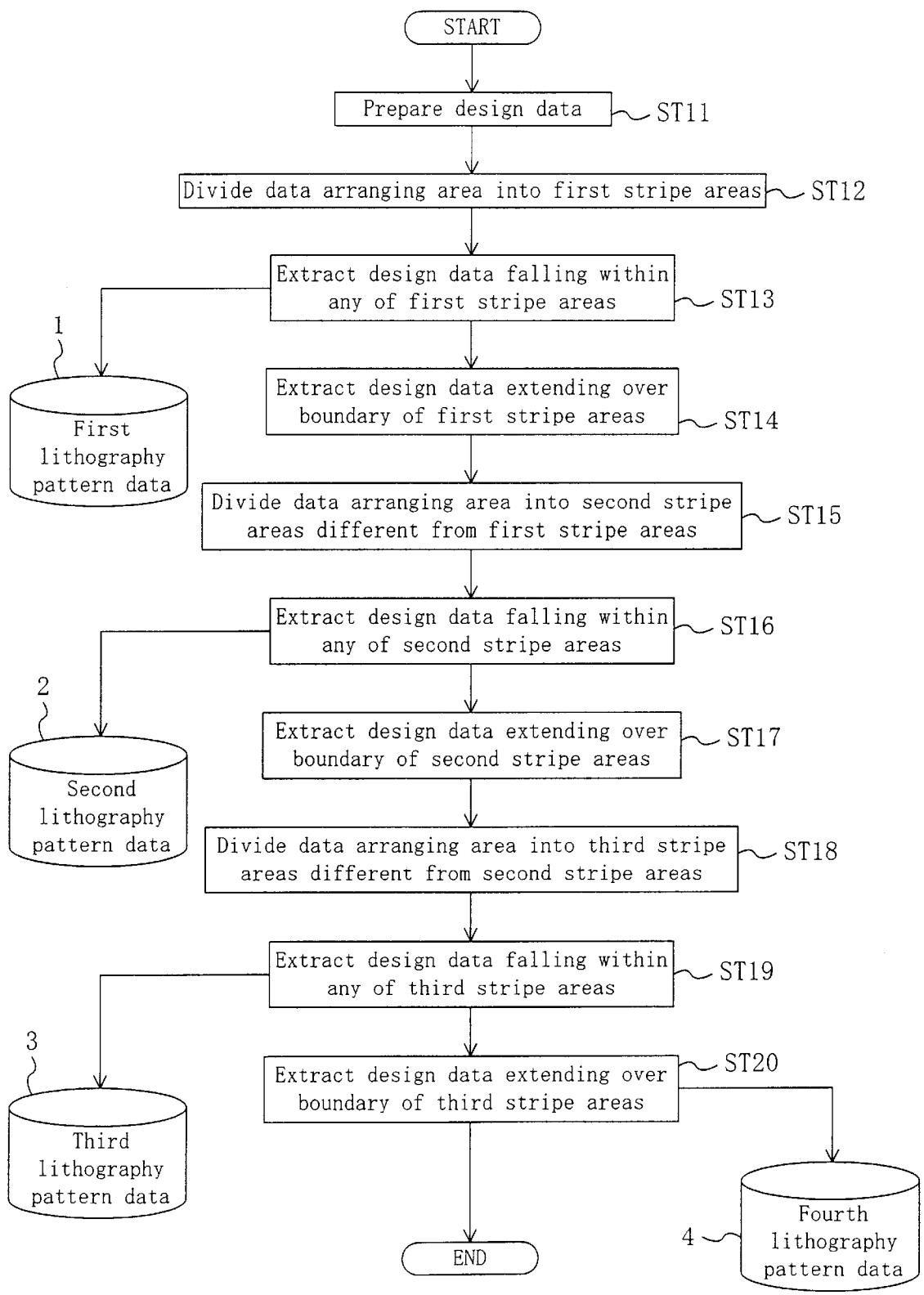
FIG. 5 is a process flowchart of a lithography pattern data generation method according to Embodiment 2 of the invention.
Figure 6A:
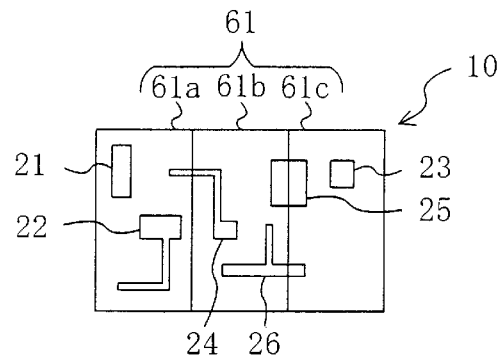
FIGS. 6(a) through 6(e) are plan views of design data groups in respective procedures in the lithography pattern data generation method of Embodiment 2.
Figure 6B:
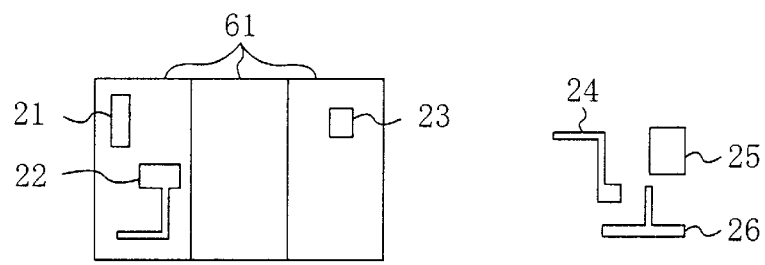

FIG. 5 is a process flowchart of a lithography pattern data generation method of Embodiment 2, and FIGS. 6(a) through 6(e) show the layout of design data in respective procedures in the lithography pattern data generation method of Embodiment 2. First, in a design data preparing process ST11 of FIG. 5, plural design data 21 through 26 corresponding to design patterns to be formed on a substrate are prepared on a data arranging area 10 as is shown in FIG. 6(a).

Next, in a first area dividing process ST12 of FIG. 5, the data arranging area 10 is divided into a first stripe area group 61 including stripe areas 61a through 61c each with a width of approximately 5 mm.

Then, in a first data group extracting process ST13 of FIG. 5, design data each falling within any of the stripe areas are extracted from the plural design data as a first design data group. Accordingly, in FIG. 6(b), since each of the design data 21 through 23 falls within any of the stripe areas 61a and 61c, the first design data group consists of the design data 21 through 23. Subsequently, first lithography pattern data 1 of each stripe area of the first stripe area group 61 are generated from the design data 21 through 23 belonging to the first design data group.

Next, in a second data group extracting process ST14 of FIG. 5, design data each extending over the plural stripe areas of the first stripe area group 61 are extracted as a second design data group. As is shown in FIG. 6(a), the design data 24 extends over the adjacent stripe areas 61a and 61b, and the design data 25 and 26 extend over the adjacent stripe areas 61b and 61c. Therefore, the second design data group consists of the design data 24 through 26.

Figure 6C:
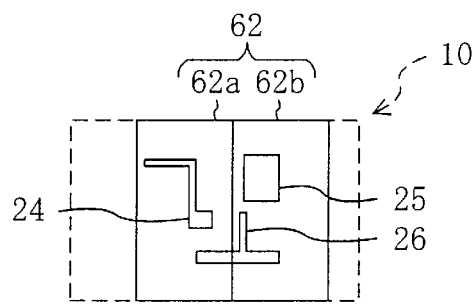

Then, in a second area dividing process ST15 of FIG. 5, as is shown in FIG. 6(c), the data arranging area 10 is divided into a second stripe area group 62 including stripe areas 62a and 62b, which cover the design data 24 and 25, respectively, and are differently divided from the first stripe area group 61.

Figure 6D:
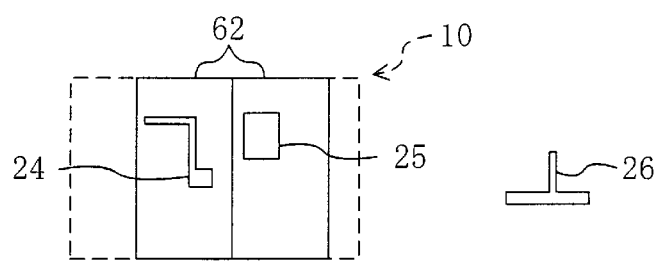

Next, in a third data group extracting process ST16 of FIG. 5, design data each falling within any of the stripe areas of the second stripe area group 62 are extracted from the second design data group as a third design data group. In FIG. 6(d), the design data 24 and 25 fall within the stripe areas 62a and 62b, respectively, and hence the third design data group consists of the design data 24 and 25. Accordingly, second lithography pattern data 2 of each stripe area of the second stripe area group 62 are generated from the design data 24 and 25 belonging to the third design data group.

Then, in a fourth data group extracting process ST17 of FIG. 5, design data each extending over adjacent stripe areas of the second stripe area group 62 are extracted as a fourth design data group. As is shown in FIG. 6(c), the design data 26 extends over the adjacent stripe areas 62a and 62b, and the fourth design data group consists of the design data 26.

Figure 6E:
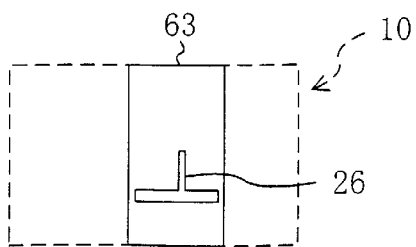

Next, in a third area dividing process ST18 of FIG. 5, the data arranging area 10 is divided to obtain a third stripe area 63 as is shown in FIG. 6(e), which covers the design data 26 belonging to the fourth design data group and is differently divided from the second stripe area group 62.

Subsequently, in a fifth data group extracting process ST19 of FIG. 5, design data each falling within the third stripe area is extracted from the fourth design data group as a fifth design data group. In FIG. 6(e), the design data 26 falls within the third stripe area 63, and hence the fifth design data group consists of the design data 26. Accordingly, a third lithography pattern data 3 of the third stripe area 63 is generated from the design data 26 belonging to the fifth design data group.

Then, in a sixth data group extracting process ST20 of FIG. 5, design data each extending over the boundary of the third stripe area (group) 63 are extracted as a sixth design data group, and fourth lithography pattern data of each stripe area of the third stripe area (group) 63 are generated from design data belonging to the extracted sixth design data group.

However, in the exemplified layout shown in FIG. 6(e), there is no design data extending over the boundary of the third stripe area 63, and hence, the sixth design data group is not generated in this case.

In this embodiment, merely the basic concept of the invention is described, and the elements of the fourth and fifth design data groups are the design data 26 alone. The number of design data used in an actual semiconductor device is huge, and therefore, it seems that there remain a large number of design data extending over the boundaries of the adjacent stripe areas after the three dividing processes for obtaining the third stripe area (group) 63. Accordingly, actual generation of lithography pattern data is carried out as the data process using a computer, and the dividing process is repeatedly conducted with the dividing positions of the stripe area groups successively changing so as to decrease the number of design data extending over adjacent stripe areas, preferably until there is no design data extending over adjacent stripe areas. However, when the number of times of repeating the dividing process is too large, the through-put time can be largely increased depending upon the scale of the design data, and therefore, the number of times of repeating the dividing process should be naturally controlled.

Also in this embodiment, in the first data group extracting process ST13, the third data group extracting process ST16 or the fifth data group extracting process ST19, each stripe area can be provided with an extraction width of 0.5 μm as in Modification 1 of Embodiment 1. Furthermore, in the first data group extracting process ST13, the third data group extracting process ST16 or the fifth data group extracting process ST19, a design data having a portion crossing a boundary of stripe areas in the size exceeding a predetermined value-can be extracted as the first design data group, the third design data group or the fifth design data group as in Modification 2 of Embodiment 1.

In this manner, in this embodiment, the data arranging area 10 is divided by using one stripe area group corresponding to a partial exposure area controlled by the deflectable width of the exposure beam. Then, merely design data extending over the adjacent stripe areas are extracted, and the data arranging area 10 is divided again by using another stripe area group so that at least one of the design data extending over the stripe areas can be made not to extend over new stripe areas. Such a dividing process is repeated until none of the prepared plural design data extends over the stripe areas, so that the resultant lithography pattern data can be free from a connection error. Accordingly, exposed patterns drawn on the basis of the lithography pattern data can be remarkably improved in the accuracy.

MODIFICATION 1 OF EMBODIMENT 2

Modification 1 of Embodiment 2 will now be described with reference to the accompanying drawings.

Figure 7A:
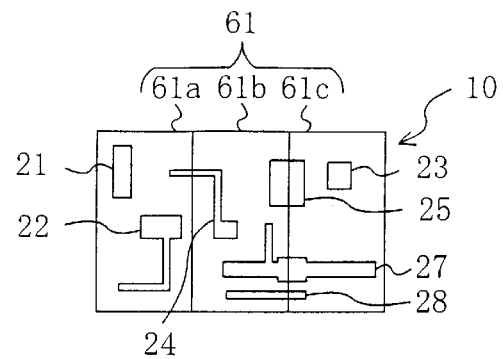
FIGS. 7(a) through 7(d) are plan views of design data groups in respective procedures in a lithography pattern data generation method of Modification 1 of Embodiment 2.

FIGS. 7(a) through 7(d) and 8(a) through 8(c) show the layout of design data in respective procedures in a lithography pattern data generation method of this modification. In FIGS. 7(a) through 7(d) and 8(a) through 8(c), like reference numerals are used to refer to like elements used in FIGS. 6(a) through 6(e), so as to omit the description. In the data generation of this modification, prepared design data includes a design data 27 having a size (length) along the widthwise direction of a stripe area larger than the width of the stripe area and including a wide portion 27a as is shown in FIG. 7(a).

Figure 7B:
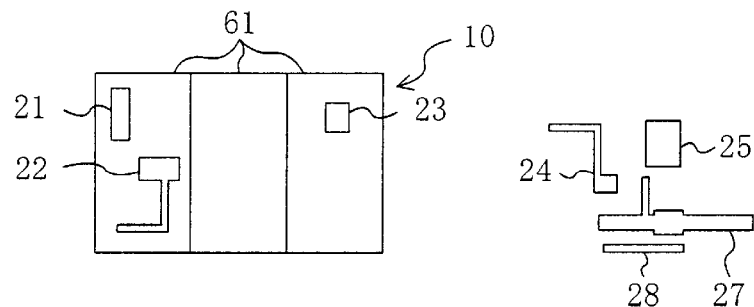

First, as is shown in FIG. 7(b), the first design data group consists of the design data 21 through 23, and the second design data group consists of the design data 24 through 28.

Figure 7C:
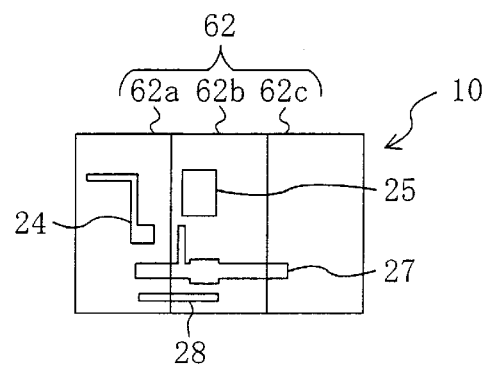
Figure 7D:
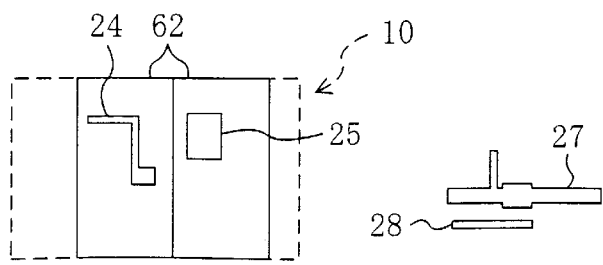

Then, as is shown in FIG. 7(c), since the data arranging area 10 is divided into the second stripe area group 62 so that each of the design data 24 and 25 belonging to the second design data group falls within one stripe area, the fourth design data group consists of the design data 27 and 28 as is shown in FIG. 7(d).

Figure 8A:
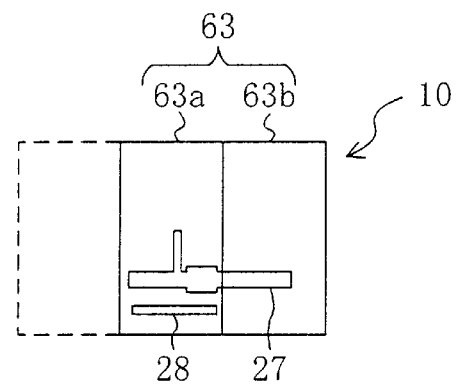
FIGS. 8(a) through 8(c) are plan views of design data groups in respective procedures in the lithography pattern data generation method of Modification 1 of Embodiment 2.
Figure 8B:
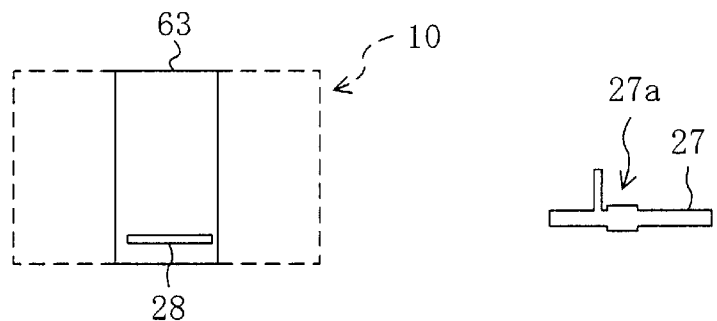

Next, as is shown in FIGS. 8(a) and 8(b), when the data arranging area 10 is divided so that the design data 28 belonging to the fourth design data group can fall within one stripe area of the third stripe area group 63, the sixth design data group consists of the design data 27 because it extends over the boundary of the stripe areas.

Figure 8C:
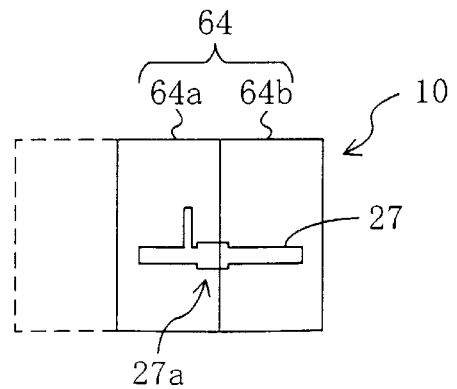
Figure 9A:
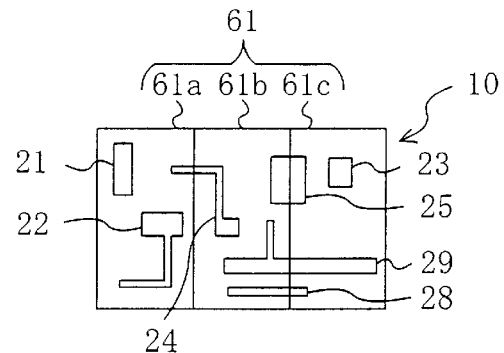
FIGS. 9(a) through 9(d) are plan views of design data groups in respective procedures in a lithography pattern data generation method of Modification 2 of Embodiment 2.
Figure 9B:
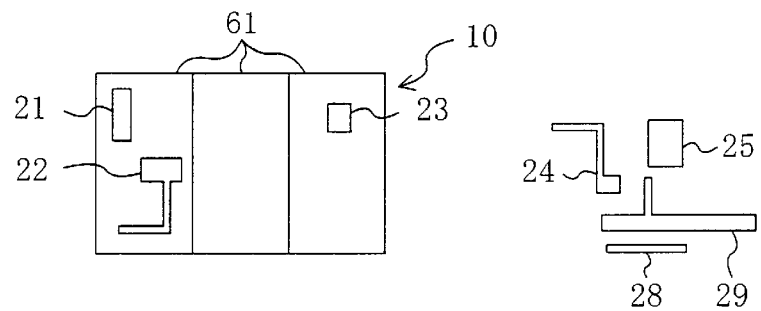
Figure 9C:
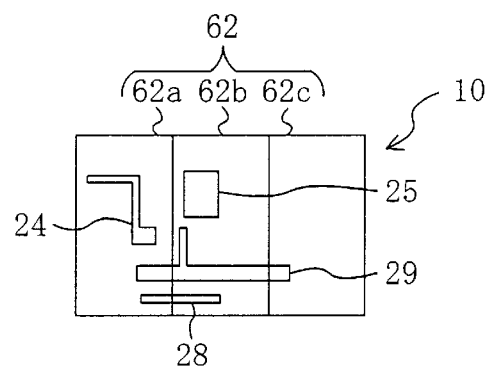
Figure 9D:
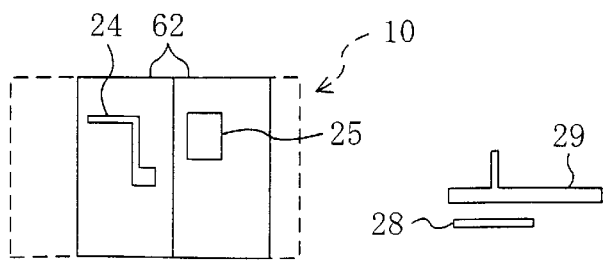

Then, as is shown in FIG. 8(c), a design data having a size, along the widthwise direction of the stripe area, larger than the width of the stripe area is extracted from the design data belonging to the sixth design data group. The design data having a size, along the widthwise direction of the stripe area, larger than the width of the stripe area can never fall within one stripe area, and hence, the dividing process of the data arranging area 10 cannot be converged no matter how many times it is repeated.

Accordingly, in this modification, the design data 27 is extracted, which has the wide portion 27a with a length, perpendicular to the exposure direction corresponding to the extending direction of the stripe area, smaller than the width of the stripe area and a width scarcely causing a connection error, for example, of 1 μm or more. Subsequently, the data arranging area 10 is divided into a fourth stripe area group 64 including stripe areas 64a and 64b so that the boundary therebetween can be positioned on the wide portion 27a of the design data 27.

When the data arranging area 10 is thus divided so that the wide portion 27a of the design data 27 with a width exceeding the predetermined value can be positioned on the boundary in the fourth stripe area group 64, a connection error is minimally caused in the resultant exposed pattern even when it is obtained from the design data divided between the stripe areas.

MODIFICATION 2 OF EMBODIMENT 2

Modification 2 of Embodiment 2 will now be described with reference to the accompanying drawings.

FIGS. 9(a) through 9(d) and 10(a) through 10(c) show the layout of design data in respective procedures in a lithography pattern data generation method of this modification. In FIGS. 9(a) through 9(d) and 10(a) through 10(c), like reference numerals are used to refer to like elements used in FIGS. 7(a) through 7(d) and 8(a) through 8(c), so as to omit the description.

In Modification 1 of Embodiment 2, as is shown in FIGS. 8(b) and 8(c), after the design data 27 having the size, along the widthwise direction of the stripe area, larger than the width of the stripe area is extracted from the design data belonging to the sixth design data group, since the extracted design data 27 has the wide portion 27a with a width exceeding the predetermined value, the data arranging area 10 is divided into the fourth stripe area group 64 so that the wide portion 27a can be positioned on the boundary.

Figure 10A:
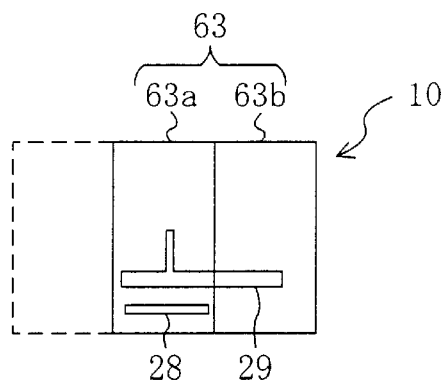
FIGS. 10(a) through 10(c) are plan views of design data groups in respective procedures in the lithography pattern data generation method of Modification 2 of Embodiment 2.
Figure 10B:
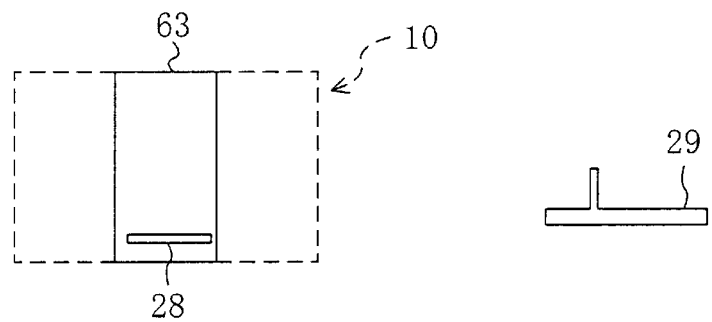
Figure 10C:
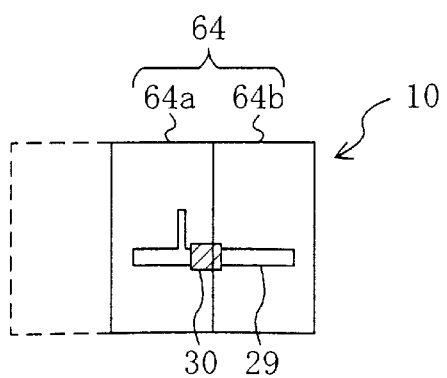

In this modification, as is shown in FIG. 10(c), a design data 29 having the size, along the widthwise direction of the stripe area, larger than the width of the stripe area does not have a wide portion as that of the design data 27 of Modification 1. Therefore, an auxiliary pattern data 30 for preventing deformation of an exposed pattern is positively added onto a portion of the design data 29 crossing the boundary in the fourth stripe area group 64.

In this manner, although the design data 29 does not have a wide portion as that in Modification 1, a connection error is scarcely caused in the resultant exposed pattern.

Furthermore, as a third modification, the design data 29 extending over the plural stripe areas can be subjected to multiple exposure used in writing a photomask. When the multiple exposure is conducted on the design data 29 extending over the boundary between the stripe areas, a connection error can be avoided.

In this manner, a highly accurate exposed pattern can be obtained by adding the auxiliary pattern data 30 to the design data 29 extending over the boundary of the stripe areas or by conducting the multiple exposure. In addition, the addition of the auxiliary pattern data or the multiple exposure is carried out on the specified design data alone, and hence, the degradation of the through-put can be prevented.

EMBODIMENT 3

Embodiment 3 of the invention will now be described with reference to the accompanying drawings.

FIGS. 11(a) through 11(e) show the layout of design data in respective procedures in a lithography pattern data generation method of Embodiment 3.

This embodiment is characterized by classifying prepared design data in accordance with a pattern width.

Figure 11A:
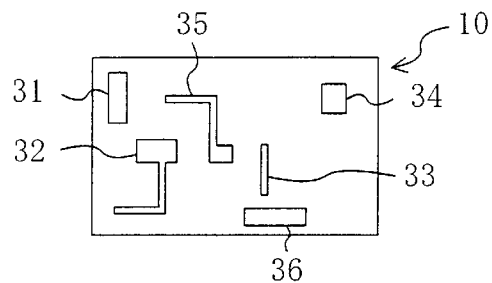
FIGS. 11(a) through 11(e) are plan views of design data groups in respective procedures in a lithography pattern data generation method of Embodiment 3 of the invention.

First, as is shown in FIG. 11(a), plural design data 31 through 36 are arranged on a design data arranging area 10. Among these design data, the design data 32 and 35 are in the shape of a composite figure formed by connecting a figure with a comparatively large width and another figure with a comparatively small width.

Figure 11B:
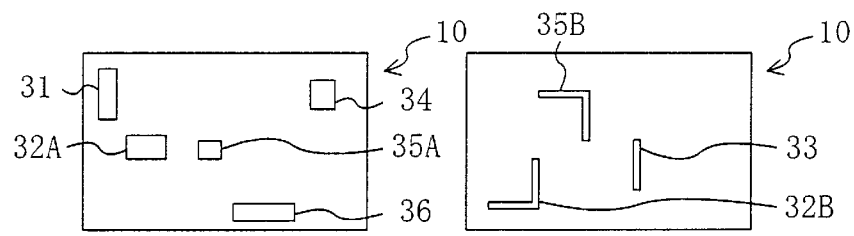

Next, as is shown in FIG. 11(b), the design data are classified into a first design data group with a pattern width exceeding, for example, 1 μm and a second design data group with a pattern width of 1 μm or less. Furthermore, the design data 32 and 35 are herein divided into figure units. Accordingly, the first design data group consists of the design data 31, 32A, 34, 35A and 36, and the second design data group consists of the design data 32B, 33 and 35B.

Figure 11C:
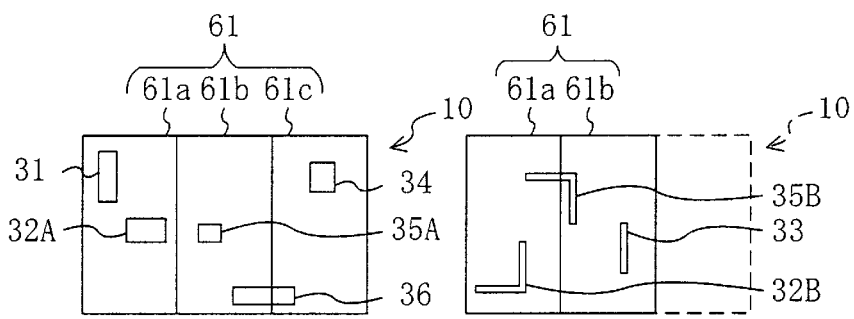

Then, as is shown in FIG. 11(c), the data arranging area 10 where the first design data group is arranged is divided into a first stripe area group 61 including stripe areas 61a through 61c each with a width of approximately 5 mm. First exposed patterns of each stripe area of the first stripe area group 61 are generated from the design data 31, 32A, 34, 35A and 36 belonging to the first design data group. At this point, the design data 36 extends over the boundary between the stripe areas 61b and 61c, but a connection error is scarcely caused because it has a pattern width larger than 1 μm. Similarly, the data arranging area 10 where the second design data group is arranged is divided into the first stripe area group 61 including the stripe areas 61a and 61b.

Figure 11D:
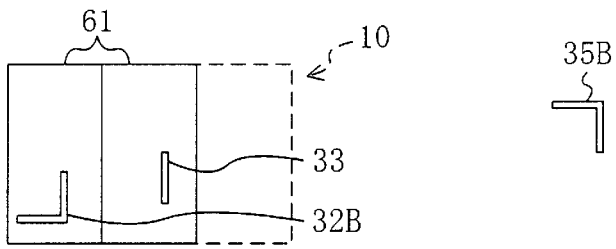

Next, as is shown in FIG. 11(d), the design data 32B and 33 each falling within any of the stripe areas of the first stripe area group 61 are extracted as a third design data group, and the design data 35B extending over the boundary is extracted as a fourth design data group. Subsequently, second lithography pattern data of each stripe area of the first stripe area group 61 are generated from the design data 32B and 33 belonging to the third design data group.

Figure 11E:
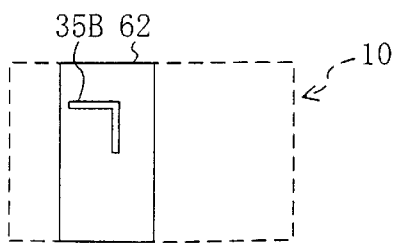

Then, as is shown in FIG. 11(e), the data arranging area 10 is divided to obtain a second stripe area 62 which covers the design data 35B and is differently divided from the first stripe area group 61. Subsequently, a third lithography pattern data of the second stripe area 62 is generated from the design data 35B belonging to the fourth design data group. At this point, the width of the second stripe area 62 can be the same as or different from the stripe width of the first stripe area group 61.

In this manner, the design data 31 through 36 are classified in accordance with a pattern width in this embodiment before dividing the data arranging area 10 into the first stripe area group 61. Accordingly, the number of design data having a pattern width smaller than the predetermined value and extending over the boundary of the stripe areas can be largely decreased. As a result, there is less fear of a connection error caused in exposed patterns, and when the process for dividing the area into the stripe areas is repeatedly conducted, the repeated processes can be more rapidly converged, resulting in improving the through-put.

Although the design data 32 and 35 are divided into figure units in this embodiment, the process for dividing a design data is not always necessary.

EMBODIMENT 4

Embodiment 4 of the invention will now be described with reference to the accompanying drawings.

Figure 12:
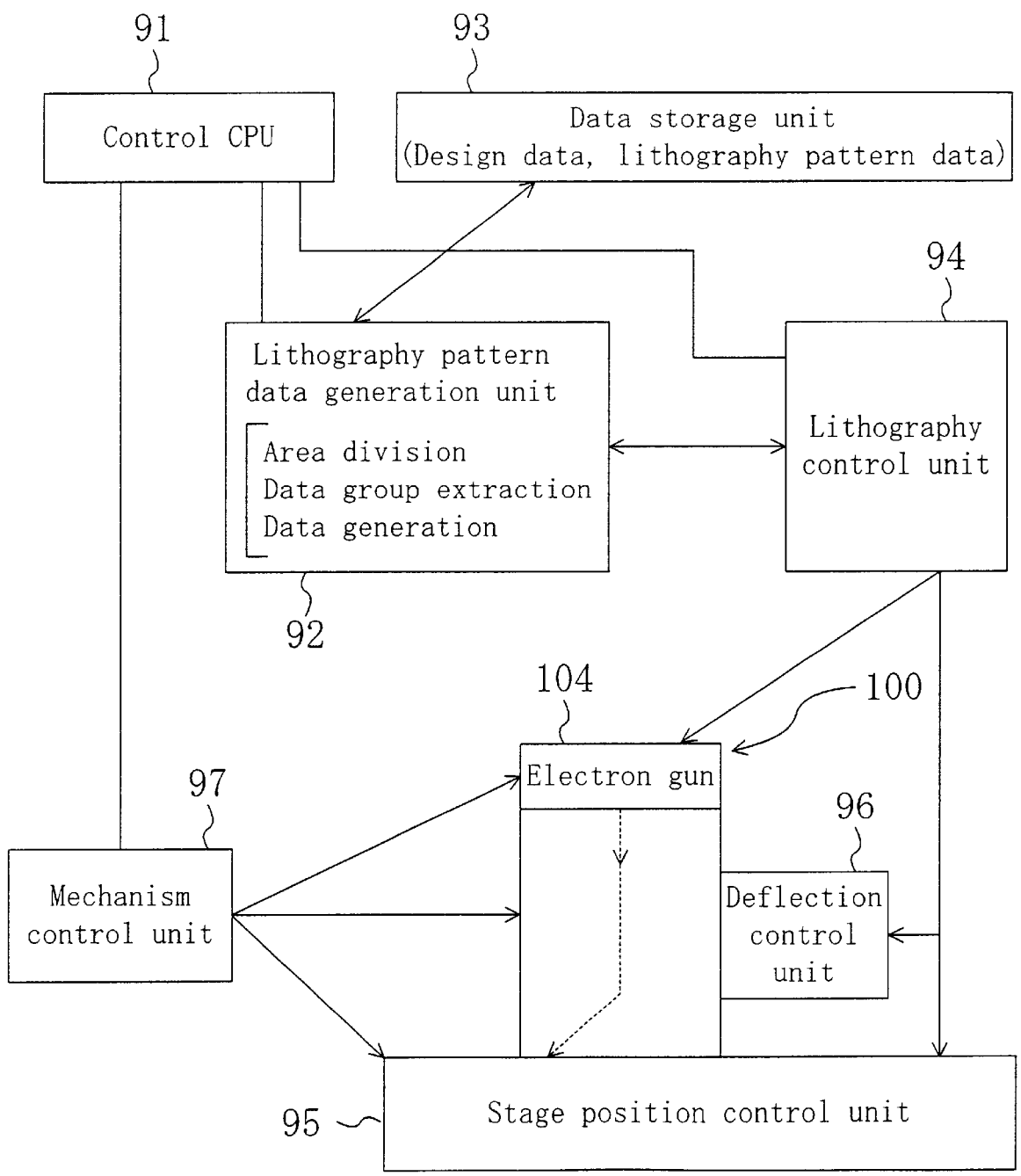
FIG. 12 is a functional block diagram of an electron beam lithography system according to Embodiment 4 of the invention.

FIG. 12 shows the functional structure of an electron beam lithography system of Embodiment 4. As is shown in FIG. 12, respective units of the electron beam lithography system 90 of this embodiment are operated under control of a control CPU 91. A lithography pattern data generation unit 92 functions in accordance with the lithography pattern data generation method of this invention, namely, a software program for realizing the lithography pattern data generation method described in any of Embodiments 1 through 3.

The lithography pattern data generation unit 92 includes an area dividing part for dividing a data arranging area corresponding to a pattern formation area on a substrate into plural partial exposure areas each in the shape of a stripe corresponding to the deflection width of an exposure beam; a data group extracting part for extracting, from design data stored in a data storage unit 93, design data each falling within any of the plural partial exposure areas as a first design data group and extracting design data each extending over two or more of the partial exposure areas as a second design data group; and a data generating part for generating lithography pattern data of the respective partial exposure areas from the design data belonging to the first design data group and the second design data group.

A reference numeral 100 denotes an electron optical lens barrel, in which an electron gun 104 is disposed in the upper portion and a movable stage for supporting a substrate to be exposed is disposed in a position for receiving an electron beam. The structure of the electron optical lens barrel 100 will be described in detail below.

A lithography control unit 94 serving as charged particle controlling means, substrate position controlling means and beam shape controlling means controls blanking of the electron gun 104 by adjusting its output state on the basis of the lithography pattern data generated by the lithography pattern data generation unit 92. In addition, the lithography control unit 94 instructs a stage position control unit 95 to adjust the relative position of the movable stage for supporting the substrate against the electron gun 104, and instructs a deflection control unit 96 to control the shape of the electron beam by adjusting the deflection state of the electron beam.

A mechanism control unit 97 adjusts lithography environments, for example, adjusts the pressure in the electron optical lens barrel 100.

Figure 13:
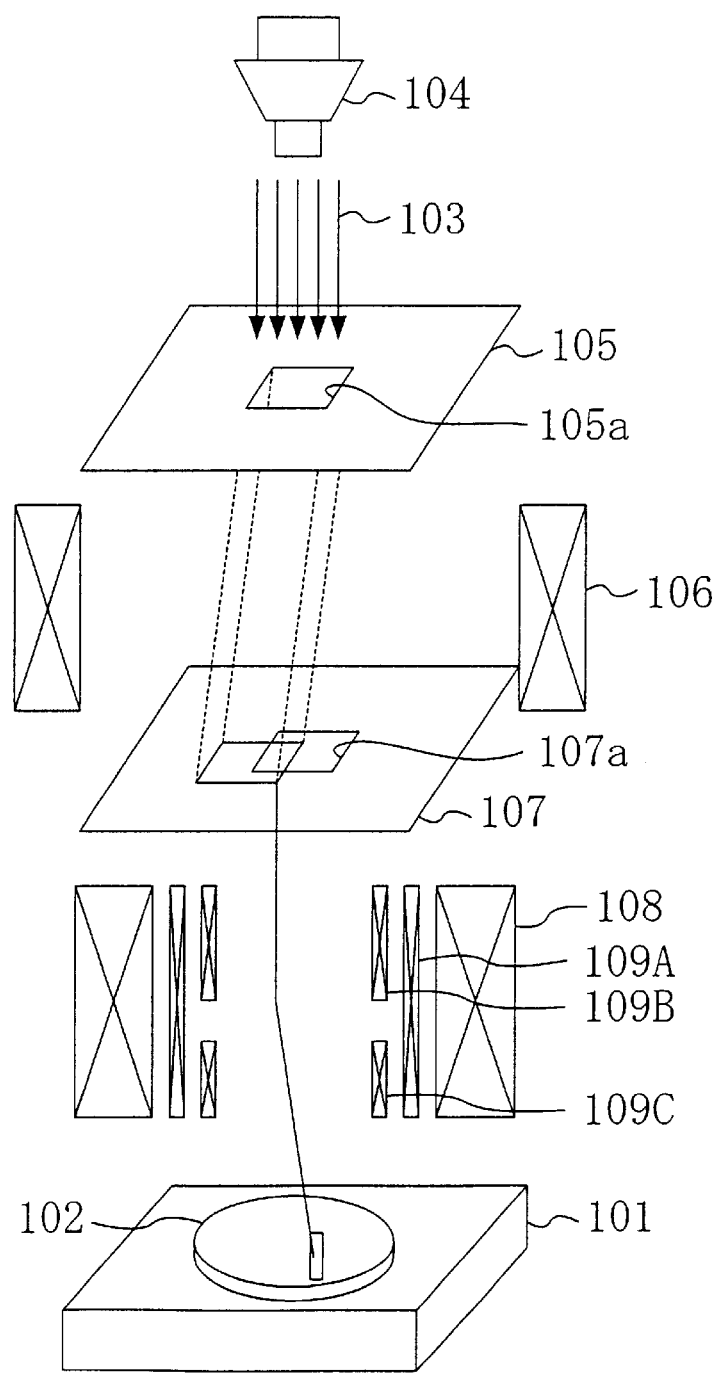
FIG. 13 is a schematic perspective view of an electron optical lens barrel of the electron beam lithography system of Embodiment 4.

FIG. 13 schematically shows the structure of the electron optical lens barrel 100 of this embodiment. As is shown in FIG. 13, above a substrate 102 supported by a movable stage 101 serving as substrate supporting means is disposed an electron gun 104, serving as charged particle producing means, for emitting an electron beam 103 toward the substrate 102. Between the movable stage 101 and the electron gun 104, a first aperture 105, serving as beam shaping means, having a first opening 105a in a square shape; a selective deflection device 106, serving as beam shaping means, for appropriately deflecting the electron beam 103 having passed through the first opening 105a; a second aperture 107, serving as beam shaping means, having a second opening 107a in a square shape; and a reducing lens 108 for reducing an exposure beam with a square section, that is, the electron beam having passed through the second opening 107a are disposed in this order in the direction from the electron gun 104 to the movable stage 101.

On the inside of the reducing lens 108, a primary deflection device 109A for deflecting the exposure beam is disposed, and on the inside of the primary deflection device 109A, a secondary deflection device 109B and a tertiary deflection device 109C are disposed in the upper portion and the lower portion, respectively.

The operation of the electron lithography system having the aforementioned structure will now be simply described.

First, as is shown in FIG. 13, the substrate 102 coated with a photosensitive material sensitive to the electron beam is supported by the movable stage 101.

Next, the electron gun 104 supplied with an acceleration voltage of approximately 50 kV emits the electron beam (exposure beam). The emitted electron beam 103 is shaped to have a square section by the first opening 105a of the first aperture 105. The electron beam 103 shaped into a square section is deflected by the selective deflection device 106 before reaching the second opening 107a, so that the electron beam 103 passing through the second opening 107a can be shaped to have a rectangular section. The thus shaped electron beam 103 is allowed to irradiate a predetermined area on the substrate 102 by the deflection devices 109A, 109B and 109C, so as to successively draw the exposed patterns in accordance with the design data. Since the deflection devices are thus provided in plural stages, higher deflection accuracy is attained.

Now, a lithography pattern fabrication method using the electron beam lithography system with the aforementioned structure will be described.

FIGS. 14(a) through 14(d) show the layout of exposed patterns in respective procedures in the lithography pattern fabrication method of this embodiment.

Figure 14A:
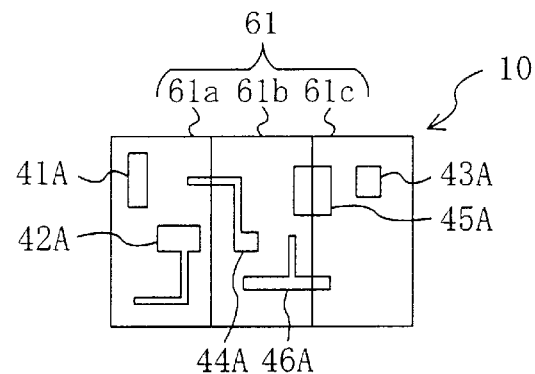
FIGS. 14(a) through 14(d) are plan views of exposed patterns in respective procedures in a lithography pattern fabrication method of Embodiment 4.

In a memory space of the data storage unit 93 of FIG. 12, a data arranging area 10 corresponding to an exposure area on a substrate is formed as is shown in FIG. 14(a), and plural design data 41A through 46A corresponding to design patterns to be formed on the substrate are prepared on the data arranging area 10. The design data 41A through 46A are herein in the same positions and in the same shapes as the design data described in Embodiment 2.

First, lithography pattern data are generated based on the design data 41A through 46A. At this point, the lithography pattern data are assumed in this embodiment to be generated by the generation method of Embodiment 2. Accordingly, the first design data group consists of the design data 41A, 42A and 43A, and the first lithography pattern data are generated from the first design data group. The third design data group consists of the design data 44A and 45A, and the second lithography pattern data are generated from the third design data group. The fourth design data group consists of the design data 46A, and the third lithography pattern data is generated from the fourth design data group. The thus generated first through third lithography pattern data are stored in the data storage unit 93.

Figure 14B:
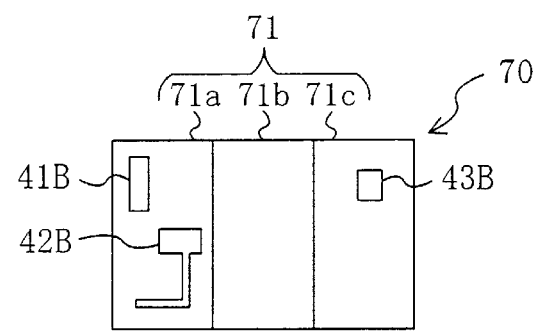

Next, the first lithography pattern data stored in the data storage unit 93 are drawn as is shown in FIG. 14(b). Specifically, lithography pattern data 41B through 41C corresponding to the design data 41A through 43A each falling within any of the stripe areas 61a through 61c of the first stripe area group 61, each in the shape of a stripe with a width of approximately 5 mm, are drawn on a pattern formation area 70 on the substrate successively in respective areas 71a, 71b and 71c of a first partial exposure area group 71.

Figure 14C:
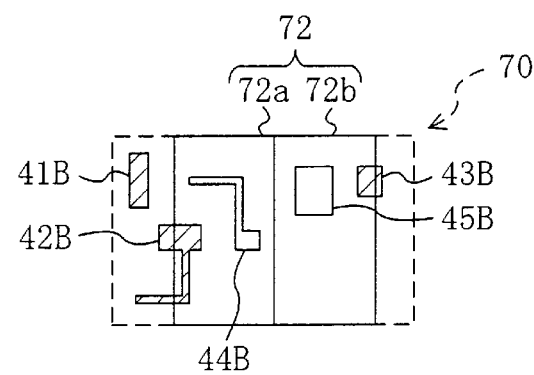

Then, the second lithography pattern data stored in the data storage unit 93 are drawn as is shown in FIG. 14(c). Specifically, lithography pattern data 44B and 45B corresponding to the design data 44A and 45A each falling within any of the stripe areas 62a and 62b of the second stripe area group 62 are drawn on the pattern formation area 70 on the substrate successively in respective areas 72a and 72b of a second partial exposure area group 72.

Figure 14D:
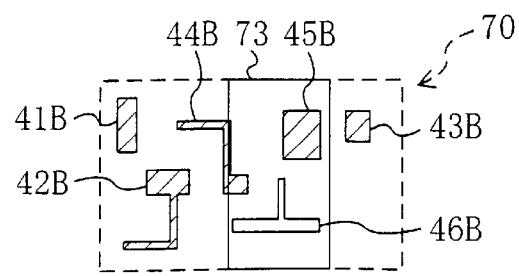

Next, the third lithography pattern data stored in the data storage unit 93 is drawn as is shown in FIG. 14(d).

Specifically, a lithography pattern data 46B corresponding to the design data 46A falling within the third stripe area 63 is drawn on the pattern formation area 70 on the substrate in a third partial exposure area 73.

Herein, the data arranging area 10 is assumed to be in the same size as the pattern formation area 70 for simplification, and hence, each stripe area for dividing the data arranging area 10 is assumed to have the same width as each partial exposure area for dividing the pattern formation area 70. An exposed pattern can be, however, generally reduced or enlarged with keeping the relative relationship in position and size between the design data and the exposed pattern.

Although the first lithography pattern data, the second lithography pattern data and the third lithography pattern data are drawn in this order in this embodiment, but the order is not herein specified as far as all the lithography pattern data can be ultimately drawn on the substrate. Similarly, the lithography pattern data are drawn in each of the partial exposure area groups 71 and 72 successively in the rightward direction in this embodiment, but the direction is not herein specified. However, since the movable stage 101 of FIG. 13 should be moved in order to proceed the lithography process from one stripe area to another stripe area, the lithography pattern data can be more efficiently drawn in a manner that adjacent stripe areas are successively exposed.

In the conventional lithography system and method, merely one dividing process is carried out for drawing all the design data. Therefore, one exposed pattern extends over plural partial exposure areas, and hence, the exposed pattern is divided. As a result, a connection error is easily caused in the lithography. However, the number of exposed patterns extending over adjacent partial exposure areas can be decreased in this embodiment, resulting in reducing connection errors. Accordingly, highly accurate exposed patterns can be obtained.

Since the electron beam lithography system 90 of this embodiment is operated on the basis of lithography pattern data generated by the lithography pattern data generation unit 92 of FIG. 12, the following auxiliary functions described in Embodiments 1 through 3 and their modifications can be reflected in lithography pattern data to be generated:

(1) To increase the number of data belonging to a design data group extracted at an earlier stage by providing each stripe area used for extracting the data group with a predetermined extraction width;

(2) To increase the number of data belonging to a design data group extracted at an early stage by extracting, among design data extending over stripe areas, a data having a portion crossing the boundary of stripe areas in a predetermined size or larger as a design data group obtained at an earlier stage;

(3) To repeat the process for dividing the data arranging area into stripe areas until none of design data extends over the stripe areas;

(4) With respect to a design data which is unavoidably divided because it has a size, along the widthwise direction of a stripe area, larger than the width of the stripe area and which has a wide portion crossing the boundary of stripe areas in a predetermined size or larger, to set the boundary between the stripe areas on the wide portion;

(5) With respect to a design data which is unavoidably divided because it has a size, along the widthwise direction of a stripe area, larger than the width of the stripe area, to add, onto a portion crossing the boundary, an auxiliary pattern data having a predetermined size or larger in the crossing portion; and (6) To conduct the multiple exposure on a design data which is unavoidably divided because it has a size, along the widthwise direction of a stripe area, larger than the width of the stripe area.

The electron beam lithography system 90 of this embodiment uses an electron beam as the exposure beam, which can be replaced with an ion beam.

Also, the width of each stripe area or each partial exposure area is set to approximately 5 mm in this embodiment, but the width can be appropriately set depending upon the electron gun 104, the conditions for controlling the electron gun and the design data. Furthermore, the stripe width of each stripe area group (or partial exposure area group) adopted for repeated division can be appropriately selected with respect to each strip area within a deflectable range of the exposure beam.

MODIFICATION 1 OF EMBODIMENT 4

Now, as a specific example of the effect (6) described above, Modification 1 of Embodiment 4 will be described with reference to the accompanying drawings.

Figure 15A:
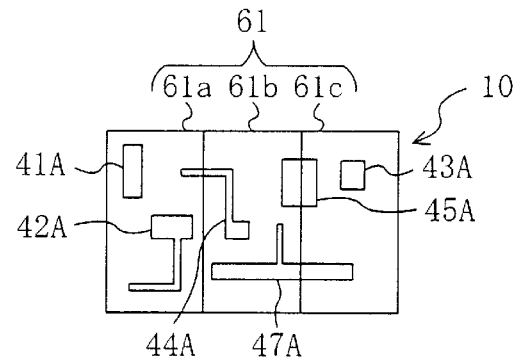
FIGS. 15(a) through 15(d) are plan views of exposed patterns in respective procedures in a lithography pattern fabrication method of a modification of Embodiment 4.
Figure 15B:
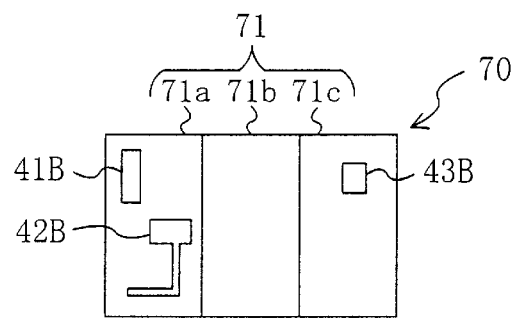
Figure 15C:
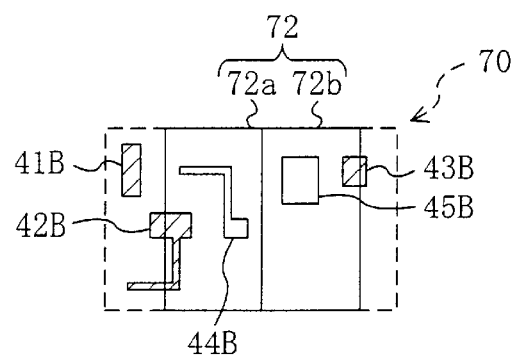

FIGS. 15(a) through 15(d) show the layout of exposed patterns in respective procedures in a lithography pattern fabrication method of this modification. In FIGS. 15(a) through 15(d), like reference numerals are used to refer to like elements shown in FIGS. 14(a) through 14(d), so as to omit the description. As is shown in FIG. 15(a), a design data 47A has a size, in a direction crossing the extending direction of a stripe area of the first stripe area group 61, larger than the width of the stripe area. Therefore, the design data 47A cannot fall within one stripe area but is unavoidably divided, and hence belongs to the fourth design data group.

Figure 15D:
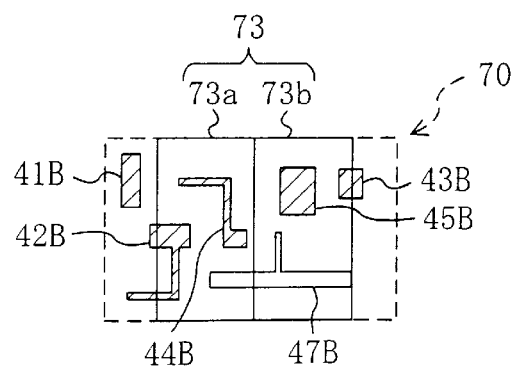

Accordingly, as is shown in FIG. 15(d), in drawing the third lithography pattern data obtained from the fourth design data group, a lithography pattern data 47B extending over partial exposure areas 73a and 73b of a third partial exposure area group 73 is subjected to the multiple exposure. As a result, a connection error is scarcely caused in the resultant pattern, and thus, the accuracy of the unavoidably divided exposed pattern can be improved.

Furthermore, the multiple exposure is conducted merely on the lithography pattern data unavoidably divided, and hence, degradation in the through-put can be minimized.

EMBODIMENT 5

Embodiment 5 of the invention will now be described with reference to the accompanying drawings.

Figure 16:
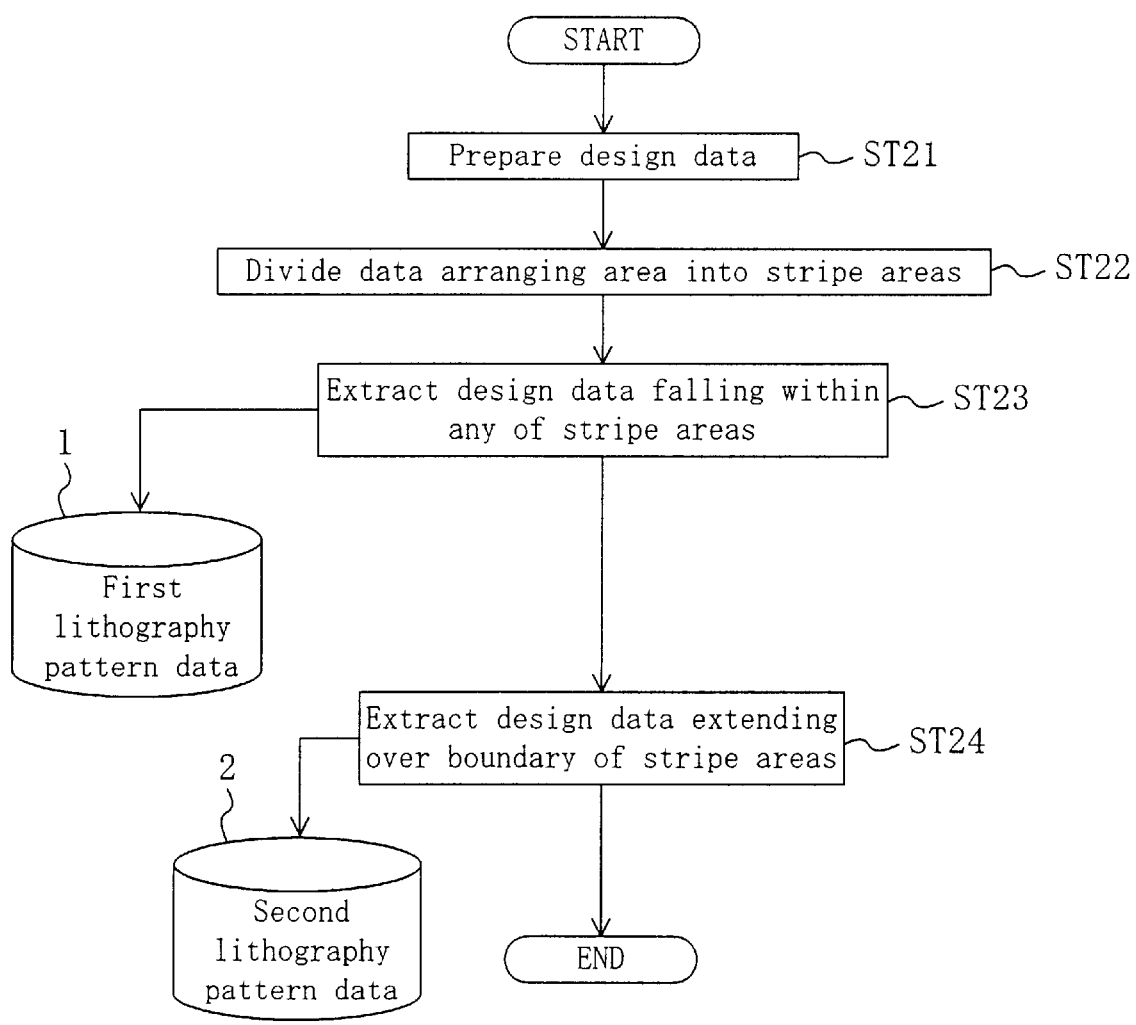
FIG. 16 is a process flowchart of a lithography pattern data generation method of Embodiment 5 of the invention.
Figure 17A:
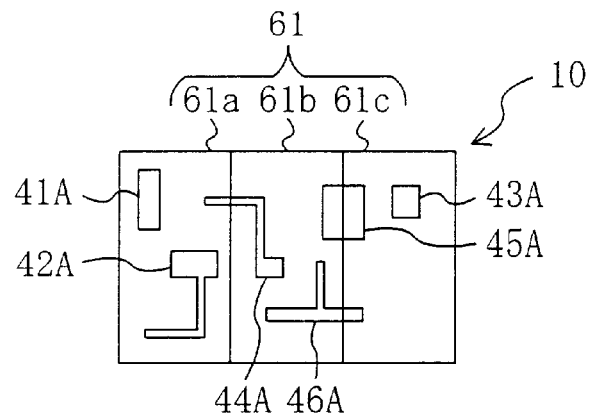
FIGS. 17(a) through 17(c) are plan views of exposed patterns obtained in respective procedures in a lithography pattern fabrication method using the lithography pattern data generation method of Embodiment 5.
Figure 17B:
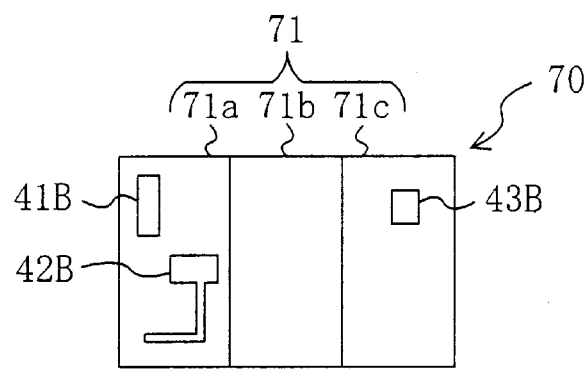
Figure 17C:
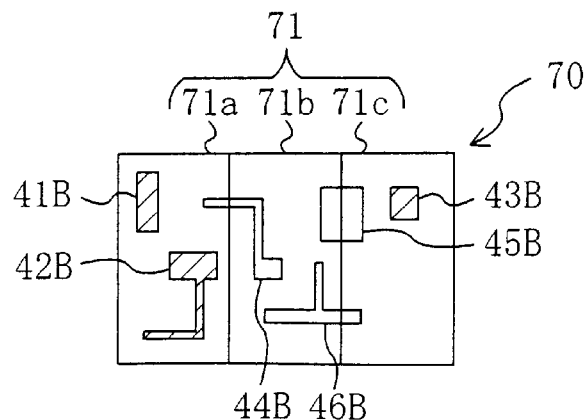
Figure 18:
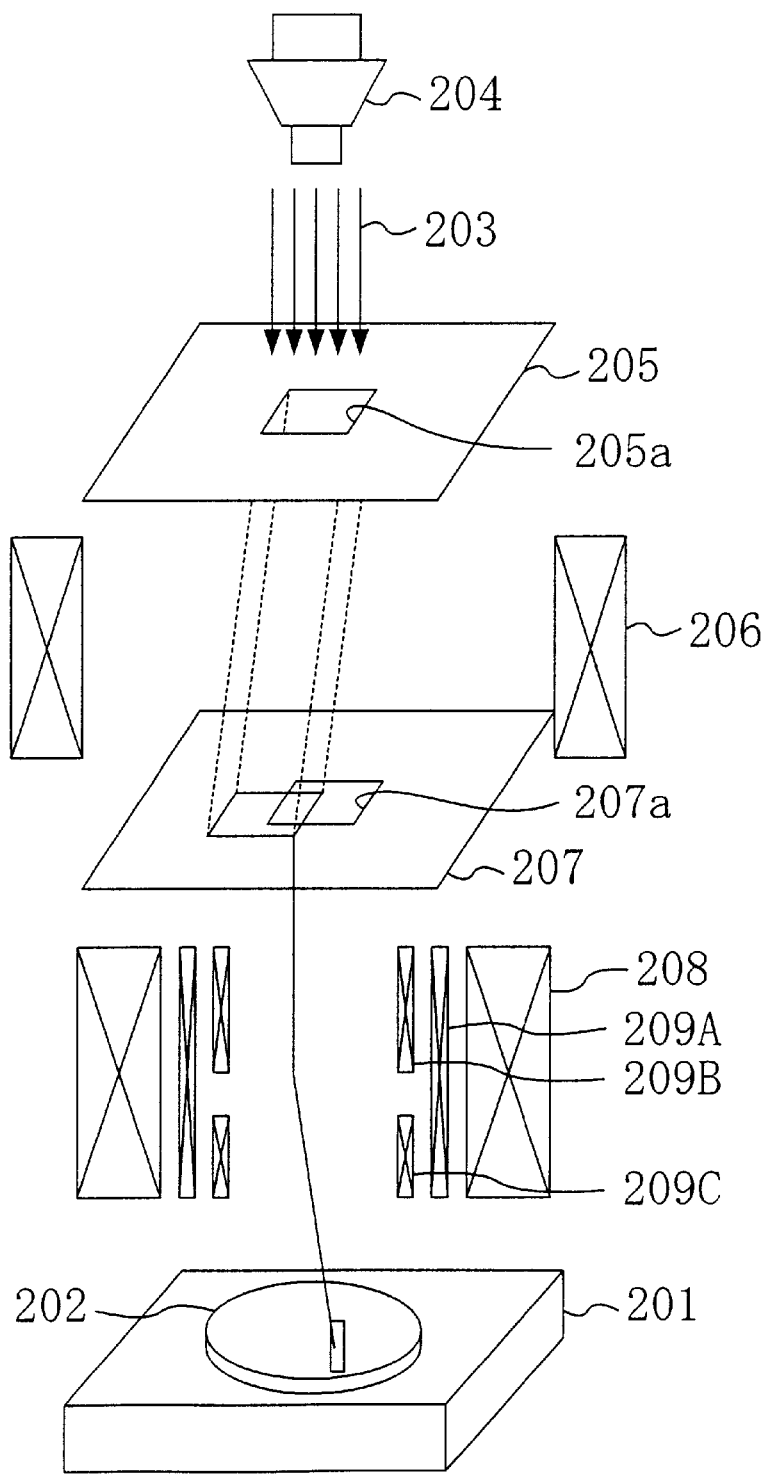
FIG. 18 is a schematic perspective view of an electron optical lens barrel of a conventional electron beam lithography system.
Figure 19:
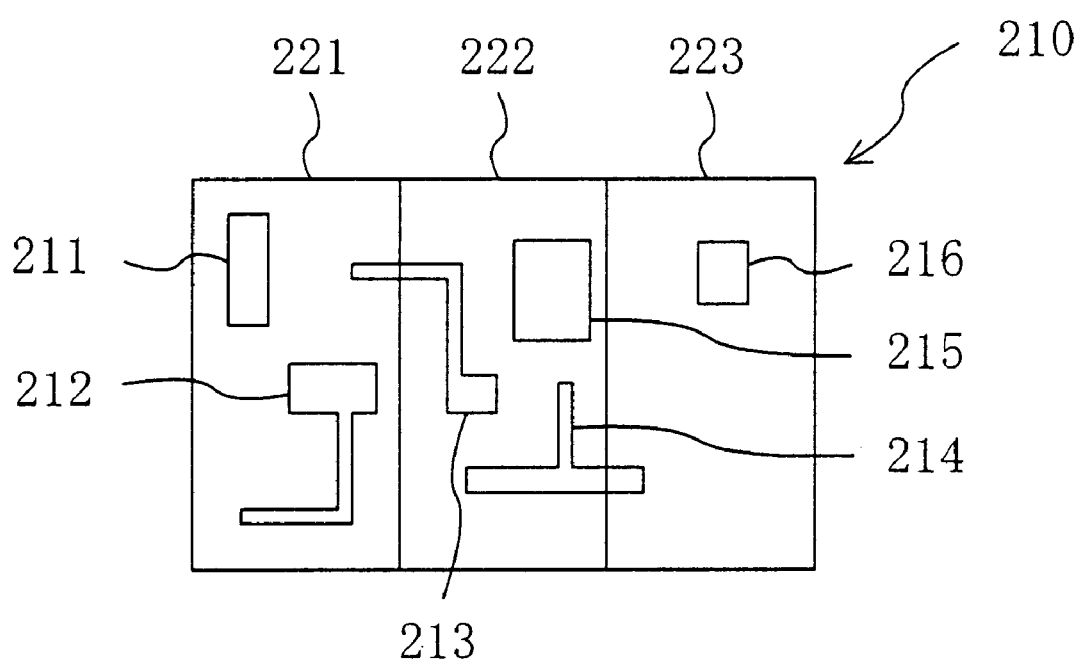
FIG. 19 is a plan view for showing an example of a conventional lithography pattern data generation method.
Figure 20A:
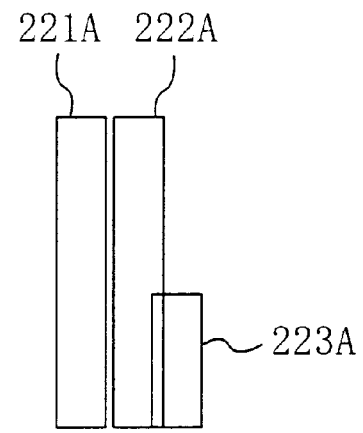
Figure 20B:
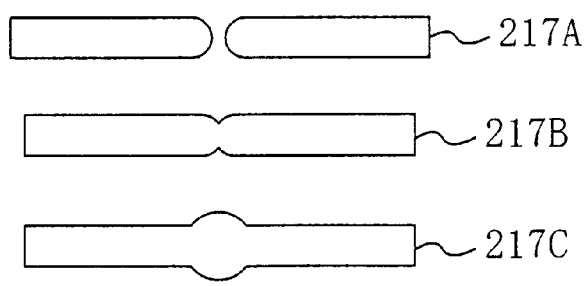

FIG. 16 is a process flowchart of a lithography pattern data generation method of Embodiment 5, and FIGS. 17(a) through 17(c) show the layout of exposed patterns obtained in respective procedures in a lithography pattern fabrication method using the lithography pattern data generation method of this embodiment.

First, in a design data preparing process ST21 of FIG. 16, plural design data 41A through 46A corresponding to design patterns to be formed on a substrate are prepared as shown in FIG. 17(a). The design data 41A through 46A are arranged on a data arranging area 10 correspondingly to a design pattern formation area.

Next, in an area dividing process ST22 of FIG. 16, the data arranging area 10 is divided into a first stripe area group 61 including three stripe areas 61a through 61c.

Then, in a first data group extracting process ST23 of FIG. 16, design data each falling within any of the stripe areas 61*a* through 61*c*, namely, not extending over any of the boundaries of the stripe areas 61*a* through 61*c*, are extracted from the design data 41A through 46A as a first design data group. Subsequently, based on the design data 41A through 43A belonging to the first design data group, first lithography pattern data 41B through 43B of each of the stripe areas 61*a* through 61*c* are generated.

Next, in a second data group extracting process ST24 of FIG. 16, design data each extending over the plural stripe areas of the first stripe area group 61 are extracted as a second design data group. Subsequently, based on the design data 44A through 46A belonging to the second design data group, second lithography pattern data 44B through 46B of each of the stripe areas 61*a* through 61*c* are generated.

Then, the first lithography pattern data 41B through 43B thus generated are transferred onto a pattern formation area 70 as is shown in FIG. 17(*b*). Subsequently, the second lithography pattern data 44B through 46B thus generated are subjected to the multiple exposure so as to transfer them onto the pattern formation area 70 as is shown in FIG. 17(*c*).

In this manner, merely the second lithography pattern data 44B through 46B extending over the stripe areas are subjected to the multiple exposure in this embodiment. Therefore, connection errors can be easily reduced. Also in this embodiment, the order of conducting the lithography process on the first lithography pattern data and the second lithography pattern data is not particularly specified.

Wherein, in the first design data group extracting process ST23, as described in MODIFICATION 1 of EMBODIMENT 1 of the present invention, each stripe area of the fist stripe area group 61 may be enlarged by a predetermine width merely in the extraction.

In each of the aforementioned embodiments, the countermeasure against connection errors between stripe areas mainly derived from primary deflection is described, but the invention can exhibit the same effect also on a connection error derived from secondary or tertiary deflection.

What is claimed is:

1. A lithography pattern data generation method for generating, from plural design data corresponding to design patterns, lithography pattern data to be drawn correspondingly to said design patterns on a substrate by using an exposure beam of charged particles, comprising:

an area dividing step of dividing a predetermined area where said plural design data are arranged, which corresponds to an area where said design patterns are to be formed, into plural partial exposure areas each in the shape of a stripe with a width corresponding to a deflection width of said exposure beam;

a data group extracting step of extracting, from said plural design data, design data each falling within any of said plural partial exposure areas as a first design data group, and extracting design data each extending over two or more of said plural partial exposure areas as a second design data group;

a first lithography pattern data generating step of generating first lithography pattern data of each of said plural partial exposure areas from said design data belonging to said first design data group; and a second lithography pattern data generating step of generating second lithography pattern data of each of said plural partial exposure areas from said design data belonging to said second design data group.

2. The lithography pattern data generation method of claim 1, wherein, in extracting said first design data group in said data group extracting step, a design data, among said design data each extending over two or more of said plural partial exposure areas, which has a portion crossing a boundary of said partial exposure areas and having a predetermined size or larger is included in said first design data group.

3. A lithography pattern data generation method for generating, from plural design data corresponding to design patterns, lithography pattern data to be drawn correspondingly to said design patterns on a substrate by using an exposure beam of charged particles, comprising:

a first area dividing step of dividing a predetermined area where said plural design data are arranged, which corresponds to an area where said design patterns are to be formed, into plural first partial exposure areas each in the shape of a stripe with a width corresponding to a deflection width of said exposure beam;

a data group extracting step of extracting, from said plural design data, design data each falling within any of said plural first partial exposure areas as a first design data group, and extracting design data each extending over two or more of said plural first partial exposure areas as a second design data group;

a first lithography pattern data generating step of generating first lithography pattern data of each of said plural first partial exposure areas from said design data belonging to said first design data group;

a second area dividing step of dividing said predetermined area into plural second partial exposure areas any of which covers at least one of said design data belonging to said second design data group, said plural second partial exposure areas being different from said plural first partial exposure areas; and a second lithography pattern data generating step of generating second lithography pattern data of each of said plural second partial exposure areas from said design data belonging to said second design data group.

4. The lithography pattern data generation method of claim 3, wherein, in said second area dividing step, each of said plural second partial exposure areas has a width different from a width of each of said plural first partial exposure areas.

5. The lithography pattern data generation method of claim 3, wherein, in extracting said first design data group in said data group extracting step, each of said plural first partial exposure areas is enlarged by a predetermined width, and said first design data group is extracted on the basis of said plural first partial exposure areas with the enlarged width.

6. The lithography pattern data generation method of claim 5, wherein, in extracting said first design data group in said data group extracting step, a design data, among said design data each extending over two or more of said plural first partial exposure areas, which has a portion crossing a boundary of said plural first partial exposure areas and having a predetermined size or larger is included in said first design data group.

7. A lithography pattern data generation method for generating, from plural design data corresponding to design patterns, lithography pattern data to be drawn correspondingly to said design patterns on a substrate by using an exposure beam of charged particles, comprising:

a first area dividing step of dividing a predetermined area where said plural design data are arranged, which corresponds to an area where said design patterns are to be formed, into plural first partial exposure areas each in the shape of a stripe with a width corresponding to a deflection width of said exposure beam;

a first data group extracting step of extracting, from said plural design data, design data each falling within any of said plural first partial exposure areas as a first design data group, and extracting design data each extending over two or more of said plural first partial exposure areas as a second design data group;

a first lithography pattern data generating step of generating first lithography pattern data of each of said plural first partial exposure areas from said design data belonging to said first design data group;

a second area dividing step of dividing said predetermined area into plural second partial exposure areas any of which covers at least one of said design data belonging to said second design data group, said plural second partial exposure areas being different from said plural first partial exposure areas;

a second data group extracting step of extracting, from said second design data group, design data each falling within any of said plural second partial exposure areas as a third design data group, and extracting design data each extending over two or more of said plural second partial exposure areas as a fourth design data group;

a second lithography pattern data generating step of generating second lithography pattern data of each of said plural second partial exposure areas from said design data belonging to said third design data group;

a third area dividing step of dividing said predetermined area into plural third partial exposure areas any of which covers at least one of said design data belonging to said fourth design data group, said plural third partial exposure areas being different from said plural second partial exposure areas; and a third lithography pattern data generating step of generating third lithography pattern data of each of said third partial exposure areas from said design data belonging to said fourth design data group.

8. The lithography pattern data generation method of claim 7, wherein, in said second area dividing step, each of said plural second partial exposure areas has a width different from a width of each of said plural first partial exposure areas, and in said third area dividing step, each of said plural third partial exposure areas has a width different from the width of each of said plural first partial exposure areas or the width of each of said plural second partial exposure areas.

9. The lithography pattern data generation method of claim 7, further comprising, after said third lithography pattern data generating step, a repeating step of repeating sub-steps of dividing said predetermined area into plural partial exposure areas and generating lithography pattern data until none of said design data extends over two or more of said plural partial exposure areas.

10. The lithography pattern data generation method of claim 7, wherein, in extracting said first design data group in said first data group extracting step, each of said first partial exposure areas is enlarged by a predetermined width, and said first design data group is extracted on the basis of said first partial exposure areas with the enlarged width, in extracting said third design data group in said second data group extracting step, each of said second partial exposure areas is enlarged by a predetermined width, and said third design data group is extracted on the basis of said second partial exposure areas with the enlarged width.

11. The lithography pattern data generation method of claim 10, wherein, in extracting said first design data group in said first data group extracting step, a design data, among said design data each extending over two or more of said plural first partial exposure areas, which has a portion crossing a boundary of said first partial exposure areas and having a predetermined size or larger is included in said first design data group, and in extracting said third design data group in said second data group extracting step, a design data, among said design data each extending over two or more of said plural second partial exposure areas, which has a portion crossing a boundary of said second partial exposure areas and having a predetermined size or larger is included in said third design data group.

12. The lithography pattern data generation method of claim 7, further comprising, after said third lithography pattern data generating step, steps of:

extracting, from said design data belonging to said fourth design data group, a design data which has a size, along a widthwise direction of each third partial exposure area, larger than a width of each third partial exposure area and includes a wide portion having a length, along a perpendicular direction to an exposure direction corresponding to an extending direction of said third partial exposure areas, smaller than the width of each third partial exposure area and a width, along the exposure direction, larger than a predetermined value; and dividing said predetermined area into plural fourth partial exposure areas with said wide portion positioned on a boundary of said fourth partial exposure areas.

13. The lithography pattern data generation method of claim 7, wherein, in said third lithography pattern data generating step, with respect to a design data having a size, along a widthwise direction of each third partial exposure area, larger than a width of each third partial exposure area, an auxiliary pattern data for preventing deformation of an exposed pattern to be drawn on said substrate is added onto a portion where said design data crosses a boundary of said third partial exposure areas.

14. A lithography pattern data generation method for generating, from plural design data corresponding to design patterns, lithography pattern data to be drawn correspondingly to said design patterns on a substrate by using an exposure beam of charged particles, comprising:

a data group generating step of generating, from said plural design data, a first design data group having a pattern width equal to or larger than a predetermined value and a second design data group having a pattern width smaller than said predetermined value;

a first area dividing step of dividing a predetermined area where said plural design data are arranged, which corresponds to an area where said design patterns are to be formed, into plural first partial exposure areas each in the shape of a stripe with a width corresponding to a deflection width of said exposure beam;

a first lithography pattern data generating step of generating first lithography pattern data of each of said plural first partial exposure areas from said design data belonging to said first design data group;

a data group extracting step of extracting, from said second design data group, design data each falling within any of said plural first partial exposure areas as a third design data group, and extracting design data each extending over two or more of said plural first partial exposure areas as a fourth design data group;

a second lithography pattern data generating step of generating second lithography pattern data of each of said plural first partial exposure areas from said design data belonging to said third design data group;

a second area dividing step of dividing said predetermined area into plural second partial exposure areas any of which covers at least one of said design data belonging to said fourth design data group, said plural second partial exposure areas being different from said plural first partial exposure areas; and a third lithography pattern data generating step of generating third lithography pattern data of each of said plural second partial exposure areas from said design data belonging to said fourth design data group.

15. A lithography pattern fabrication method for generating, from plural design data corresponding to design patterns, lithography pattern data to be drawn correspondingly to said design patterns on a substrate and drawing said generated lithography pattern data on said substrate by using an exposure beam of charged particles, comprising:

a first area dividing step of dividing a predetermined area where said plural design data are arranged, which corresponds to an area where said design patterns are to be formed, into plural first partial exposure areas each in the shape of a stripe with a width corresponding to a deflection width of said exposure beam;

a data group extracting step of extracting, from said plural design data, design data each falling within any of said plural first partial exposure areas as a first design data group, and extracting design data each extending over two or more of said plural first partial exposure areas as a second design data group;

a first lithography pattern data generating step of generating first lithography pattern data of each of said plural first partial exposure areas from said design data belonging to said first design data group;

a second area dividing step of dividing said predetermined area into plural second partial exposure areas any of which covers at least one of said design data belonging to said second design data group, said plural second partial exposure areas being different from said plural first partial exposure areas;

a second lithography pattern data generating step of generating second lithography pattern data of each of said plural second partial exposure areas from said design data belonging to said second design data group;

a first patterning step of drawing first exposed patterns corresponding to said first lithography pattern data on said substrate by adjusting said exposure beam in accordance with said first lithography pattern data; and a second patterning step of drawing second exposed patterns corresponding to said second lithography pattern data on said substrate by adjusting said exposure beam in accordance with said second lithography pattern data.

16. The lithography pattern fabrication method of claim 15, wherein, in extracting said first design data group in said data group extracting step, each of said first partial exposure areas is enlarged by a predetermined width, and said first design data group is extracted on the basis of said first partial exposure areas with the enlarged width.

17. The lithography pattern fabrication method of claim 16, wherein, in extracting said first design data group in said data group extracting step, a design data, among said design data each extending over two or more of said plural first partial exposure areas, which has a portion crossing a boundary of said first partial exposure areas and having a predetermined size or larger is included in said first design data group.

18. The lithography pattern fabrication method of claim 17, wherein, in said second patterning step, multiple exposure is conducted on a design data belonging to said second design data group.

19. A lithography pattern fabrication method for generating, from plural design data corresponding to design patterns, lithography pattern data to be drawn correspondingly to said design patterns on a substrate and drawing said generated lithography pattern data on said substrate by using an exposure beam of charged particles, comprising:

a first area dividing step of dividing a predetermined area where said plural design data are arranged, which corresponds to an area where said design patterns are to be formed, into plural first partial exposure areas each in the shape of a stripe with a width corresponding to a deflection width of said exposure beam;

a first data group extracting step of extracting, from said plural design data, design data each falling within any of said plural first partial exposure areas as a first design data group, and extracting design data each extending over two or more of said plural first partial exposure areas as a second design data group;

a first lithography pattern data generating step of generating first lithography pattern data of each of said plural first partial exposure areas from said design data belonging to said first design data group;

a second area dividing step of dividing said predetermined area into plural second partial exposure areas any of which covers at least one of said design data belonging to said second design data group, said plural second partial exposure areas being different from said plural first partial exposure areas;

a second data group extracting step of extracting, from said second design data group, design data each falling within any of said plural second partial exposure areas as a third design data group, and extracting design data each extending over two or more of said plural second partial exposure areas as a fourth design data group;

a second lithography pattern data generating step of generating second lithography pattern data of each of said plural second partial exposure areas from said design data belonging to said third design data group;

a third area dividing step of dividing said predetermined area into plural third partial exposure areas any of which covers at least one of said design data belonging to said fourth design data group, said plural third partial exposure areas being different from said plural second partial exposure areas;

a third lithography pattern data generating step of generating third lithography pattern data of each of said plural third partial exposure areas from said design data belonging to said fourth design data group;

a first patterning step of drawing first exposed patterns corresponding to said first lithography pattern data on said substrate by adjusting an output state, a deflection state oran irradiation position on said substrate of said exposure beam in accordance with said first lithography pattern data;

a second patterning step of drawing second exposed patterns corresponding to said second lithography pattern data on said substrate by adjusting the output state, the deflection state or the irradiation position on said substrate of said exposure beam in accordance with said second lithography pattern data; and a third patterning step of drawing third exposed patterns corresponding to said third lithography pattern data on said substrate by adjusting the output state, the deflection state or the irradiation position on said substrate of said exposure beam in accordance with said third lithography pattern data.

20. The lithography pattern fabrication method of claim 19, wherein, in extracting said first design data group in said first data group extracting step, each of said first partial exposure areas is enlarged by a predetermined width, and said first design data group is extracted on the basis of said first partial exposure areas with the enlarged width, and in extracting said third design data group in said second data group extracting step, each of said second partial exposure areas is enlarged by a predetermined width, and said third design data group is extracted on the basis of said second partial exposure areas with the enlarged width.

21. The lithography pattern fabrication method of claim 20, wherein, in extracting said first design data group in said first data group extracting step, a design data, among said design data each extending over two or more of said plural first partial exposure areas, which has a portion crossing a boundary of said first partial exposure areas and having a predetermined size or larger is included in said first design data group, and in extracting said third design data group in said second data group extracting step, a design data, among said design data each extending over two or more of said plural second partial exposure areas, which has a portion crossing a boundary of said second partial exposure areas and having a predetermined size or larger is included in said third design data group.

22. The lithography pattern fabrication method of claim 21, wherein, in said third patterning step, multiple exposure is conducted on a design pattern belonging to said fourth design data group.

23. A lithography pattern fabrication method for generating, from plural design data corresponding to design patterns, lithography pattern data to be drawn correspondingly to said design patterns on a substrate and drawing said generated lithography pattern data on said substrate by using an exposure beam of charged particles, comprising:

an area dividing step of dividing a predetermined area where said plural design data are arranged, which corresponds to an area where said design patterns are to be formed, into plural partial exposure areas each in the shape of a stripe with a width corresponding to a deflection width of said exposure beam;

a data group extracting step of extracting, from said plural design data, design data each falling within any of said plural partial exposure areas as a first design data group, and extracting design data each extending over two or more of said plural partial exposure areas as a second design data group;

a first lithography pattern data generating step of generating first lithography pattern data of each of said plural partial exposure areas from said design data belonging to said first design data group;

a second lithography pattern data generating step of generating second lithography pattern data of each of said plural partial exposure areas from said design data belonging to said second design data group;

a first patterning step of drawing first exposed patterns corresponding to said first lithography pattern data on said substrate by adjusting said exposure beam in accordance with said first lithography pattern data; and a second patterning step of drawing second exposed patterns corresponding to said second lithography pattern data on said substrate by adjusting said exposure beam in accordance with said second lithography pattern data an d by carrying out multiple exposure.

24. The lithography pattern fabrication method of claim 23, wherein, in extracting said first design data group in said data group extracting step, a design data, among said design data each extending over two or more of said plural partial exposure areas, which has a portion crossing a boundary of said partial exposure areas and having a predetermined size or larger is included in said first design data group.

25. A charged particle lithography system for generating, from plural design data corresponding to design patterns, lithography pattern data to be drawn correspondingly to said design patterns on a substrate and drawing said generated lithography pattern data on said substrate by using an exposure beam of charged particles, comprising:

charged particle producing means for emitting said exposure beam to said substrate;

substrate supporting means for supporting said substrate;

beam shaping means disposed between said charged particle producing means and said substrate supporting means for shaping said exposure beam into a predetermined shape;

charged particle controlling means for controlling an output state of said charged particle producing means;

substrate position controlling means for determining a relative position of said substrate supporting means against said charge particle producing means;

beam shape controlling means for controlling said beam shaping means to adjust the shape of said exposure beam; and lithography pattern data generating means for generating said lithography pattern data from said plural design data, wherein said lithography pattern data generating means includes:

an area dividing part for dividing a predetermined area where said plural design data are arranged, which corresponds to an area where said design patterns are to be formed, into plural partial exposure areas each in the shape of a stripe with a variable width corresponding to a deflection width of said exposure beam;

a data group extracting part for extracting, from said plural design data, design data each falling within any of said plural partial exposure areas as a first design data group, and extracting design data each extending over two or more of said plural partial exposure areas as a second design data group; and a data generating part for generating first lithography pattern data of each of said plural partial exposure areas from said design data belonging to said first design data group, and generating second lithography pattern data of each of said plural partial exposure areas from said design data belonging to said second design data group, said charged particle controlling means controls an output state of said charged particle producing means on the basis of said-generated lithography pattern data, said substrate position controlling means changes a relative position of said substrate supported by said substrate supporting means against said exposure beam emitted by said charged particle producing means on the basis of said generated lithography pattern data, and said beam shape controlling means shapes said exposure beam into a stripe shape corresponding to each of said partial exposure areas on the basis of said generated lithography pattern data.

26. The charged particle lithography system of claim 25, wherein said lithography pattern data generating means conducts multiple exposure on said second lithography pattern data.

* * * * *

UNITED STATES PATENT AND TRADEMARK OFFICE
CERTIFICATE OF CORRECTION

PATENT NO. : 6,415,432 B1
DATED : July 2, 2002
INVENTOR(S) : Saito Takashi et al.

It is certified that error appears in the above-identified patent and that said Letters Patent is hereby corrected as shown below:

<u>Column 31,</u>
Line 8, change "oran" to -- or an --.

<u>Column 32,</u>
Line 28, change "an d" to -- and --.

<u>Column 34,</u>
Line 3, change "said-generated" to -- said generated --.

Signed and Sealed this

Fourth Day of March, 2003

JAMES E. ROGAN
*Director of the United States Patent and Trademark Office*